(12) United States Patent
Chiang et al.

(10) Patent No.: US 11,705,411 B2
(45) Date of Patent: Jul. 18, 2023

(54) CHIP PACKAGE WITH ANTENNA ELEMENT

(71) Applicant: Taiwan Semiconductor Manufacturing Company, Ltd., Hsinchu (TW)

(72) Inventors: Yung-Ping Chiang, Zhubei (TW); Yi-Che Chiang, Hsinchu (TW); Nien-Fang Wu, Chiayi (TW); Min-Chien Hsiao, Taichung (TW); Chao-Wen Shih, Zhubei (TW); Shou-Zen Chang, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 107 days.

(21) Appl. No.: 17/315,921

(22) Filed: May 10, 2021

(65) Prior Publication Data

US 2021/0265289 A1   Aug. 26, 2021

Related U.S. Application Data

(60) Continuation of application No. 16/426,365, filed on May 30, 2019, now Pat. No. 11,004,809, which is a
(Continued)

(51) Int. Cl.
*H01L 23/66* (2006.01)
*H01L 23/00* (2006.01)
(Continued)

(52) U.S. Cl.
CPC .......... *H01L 23/66* (2013.01); *H01L 21/6835* (2013.01); *H01L 23/3121* (2013.01);
(Continued)

(58) Field of Classification Search
CPC ..... H01L 21/561; H01L 21/568; H01L 23/66; H01L 2223/6677; H01L 24/93;
(Continued)

(56) References Cited

U.S. PATENT DOCUMENTS 9,000,584 B2   4/2015   Lin et al.
9,048,222 B2   6/2015   Hung et al.
(Continued)

*Primary Examiner* — Bryan R Junge
(74) *Attorney, Agent, or Firm* — Birch, Stewart, Kolasch & Birch, LLP

(57) ABSTRACT

Structures and formation methods of a chip package are provided. The chip package includes a semiconductor die having a conductive element and an antenna element over the semiconductor die. The chip package also includes a first conductive feature electrically connecting the conductive element of the semiconductor die and the antenna element. The chip package further includes a protective layer surrounding the first conductive feature. In addition, the chip package includes a second conductive feature over the first conductive feature. A portion of the second conductive feature is between the first conductive feature and the protective layer.

20 Claims, 23 Drawing Sheets

Related U.S. Application Data division of application No. 15/625,678, filed on Jun. 16, 2017, now Pat. No. 10,312,203.

(60) Provisional application No. 62/433,436, filed on Dec. 13, 2016.

(51) Int. Cl.
| | |
|---|---|
| *H01L 23/552* | (2006.01) |
| *H01L 23/31* | (2006.01) |
| *H01L 25/065* | (2023.01) |
| *H01L 21/683* | (2006.01) |
| *H01Q 9/04* | (2006.01) |
| *H01Q 21/06* | (2006.01) |
| *H01Q 21/00* | (2006.01) |
| *H01L 21/56* | (2006.01) |
| *H01L 23/538* | (2006.01) |
| *H01Q 1/22* | (2006.01) |
| *H01Q 21/22* | (2006.01) |

(52) U.S. Cl.
CPC ............ *H01L 23/552* (2013.01); *H01L 24/02* (2013.01); *H01L 24/13* (2013.01); *H01L 24/19* (2013.01); *H01L 24/24* (2013.01); *H01L 24/25* (2013.01); *H01L 24/32* (2013.01); *H01L 25/0655* (2013.01); *H01Q 9/045* (2013.01); *H01Q 21/0087* (2013.01); *H01Q 21/065* (2013.01); *H01L 21/568* (2013.01); *H01L 21/6836* (2013.01); *H01L 23/3128* (2013.01); *H01L 23/5389* (2013.01); *H01L 2221/68331* (2013.01); *H01L 2221/68359* (2013.01); *H01L 2221/68372* (2013.01); *H01L 2223/6644* (2013.01); *H01L 2223/6677* (2013.01); *H01L 2224/02331* (2013.01); *H01L 2224/02371* (2013.01); *H01L 2224/02379* (2013.01); *H01L 2224/02381* (2013.01); *H01L 2224/04105* (2013.01); *H01L 2224/12105* (2013.01); *H01L 2224/13024* (2013.01); *H01L 2224/24265* (2013.01); *H01L 2224/25171* (2013.01); *H01L 2224/32225* (2013.01); *H01L 2224/73267* (2013.01); *H01L 2224/92244* (2013.01); *H01L 2224/97* (2013.01); *H01L 2924/19041* (2013.01); *H01L 2924/19042* (2013.01); *H01L 2924/19043* (2013.01); *H01L 2924/19104* (2013.01); *H01L 2924/3025* (2013.01); *H01Q 1/2283* (2013.01); *H01Q 21/0075* (2013.01); *H01Q 21/22* (2013.01)

(58) Field of Classification Search
CPC ..... H01L 24/95; H01L 24/96; H01L 2224/93; H01L 2224/95; H01L 2224/95001; H01L 2224/96; H01L 25/00–50; H01Q 1/2283
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2003/0016162 A1 | 1/2003 | Sasada et al. |
| 2004/0082100 A1 | 4/2004 | Tsukahara et al. |
| 2004/0212536 A1 | 10/2004 | Mori et al. |
| 2011/0062336 A1* | 3/2011 | Ben-Bassat ............... G01J 5/20 257/E31.093 |
| 2012/0062439 A1* | 3/2012 | Liao ...................... H01L 25/16 29/25.01 |
| 2013/0009320 A1 | 1/2013 | Yoo et al. |
| 2013/0015544 A1* | 1/2013 | Han ........................ H01L 23/66 438/26 |
| 2013/0292808 A1 | 11/2013 | Yen et al. |
| 2014/0028518 A1* | 1/2014 | Arnold ................ H01Q 1/2283 343/841 |
| 2014/0168014 A1 | 6/2014 | Chih et al. |
| 2014/0191905 A1 | 7/2014 | Kamgaing |
| 2014/0252595 A1 | 9/2014 | Yen et al. |
| 2015/0084208 A1 | 3/2015 | Iida et al. |
| 2015/0179616 A1 | 6/2015 | Lin et al. |
| 2015/0194388 A1 | 7/2015 | Pabst et al. |
| 2016/0300797 A1 | 10/2016 | Shim et al. |
| 2017/0345731 A1 | 11/2017 | Chiang et al. |
| 2018/0012851 A1 | 1/2018 | Liu et al. |

\* cited by examiner

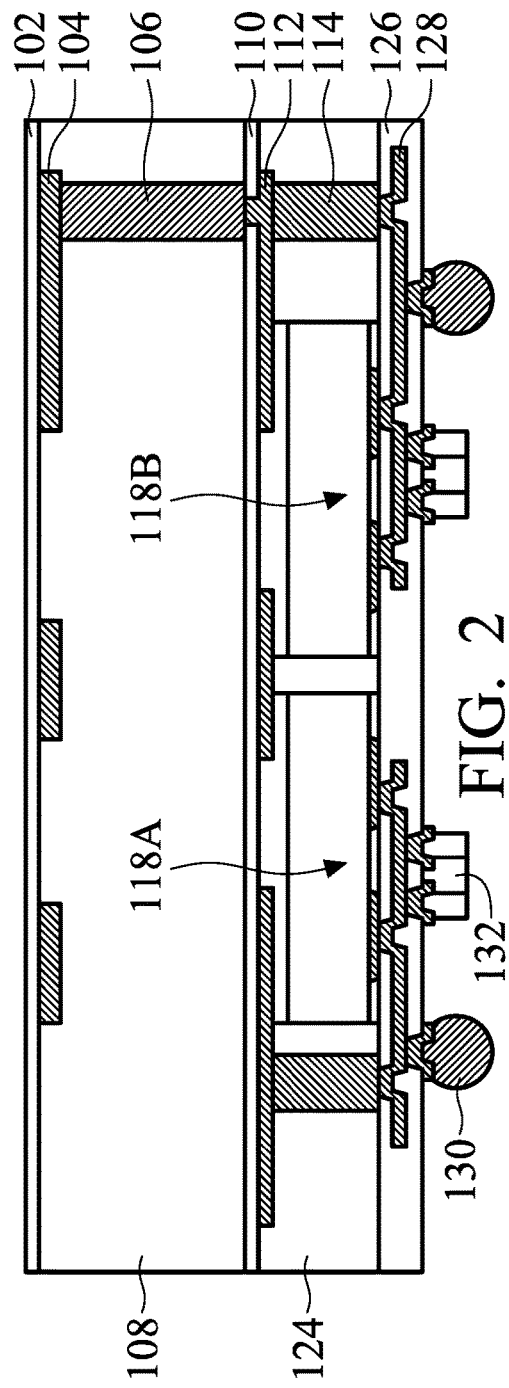
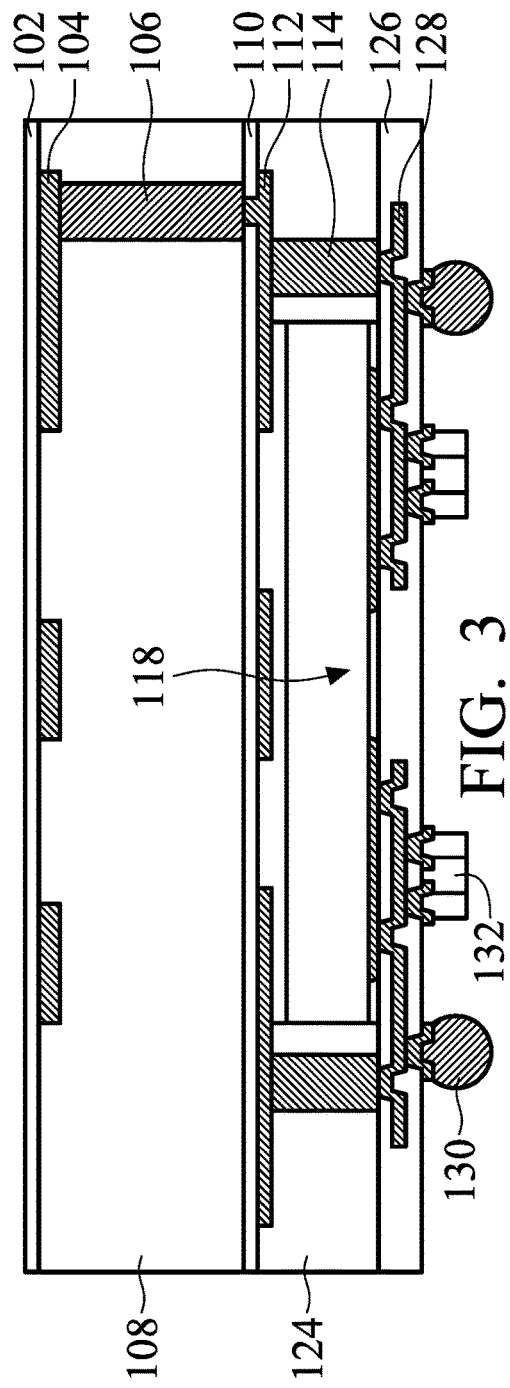

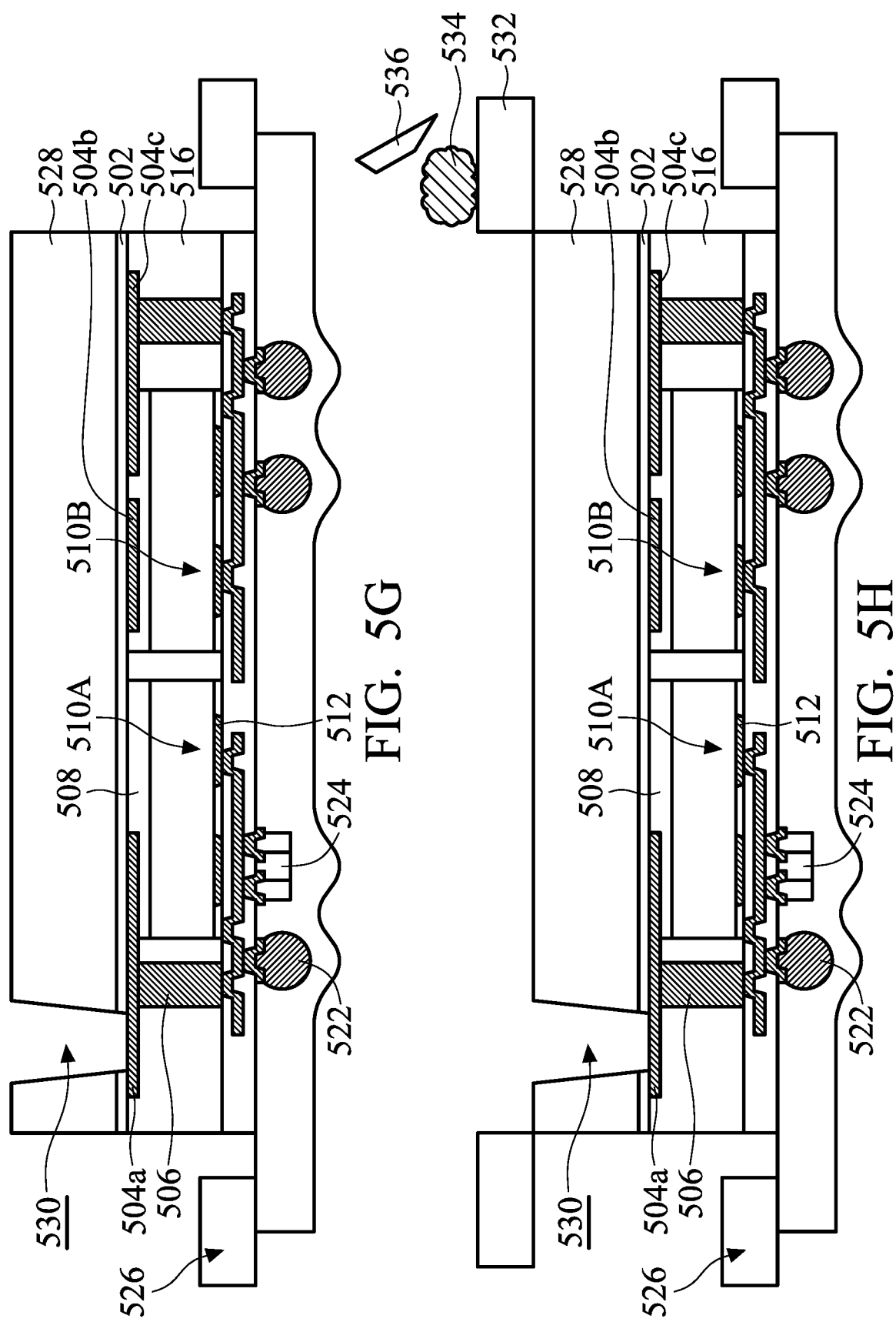

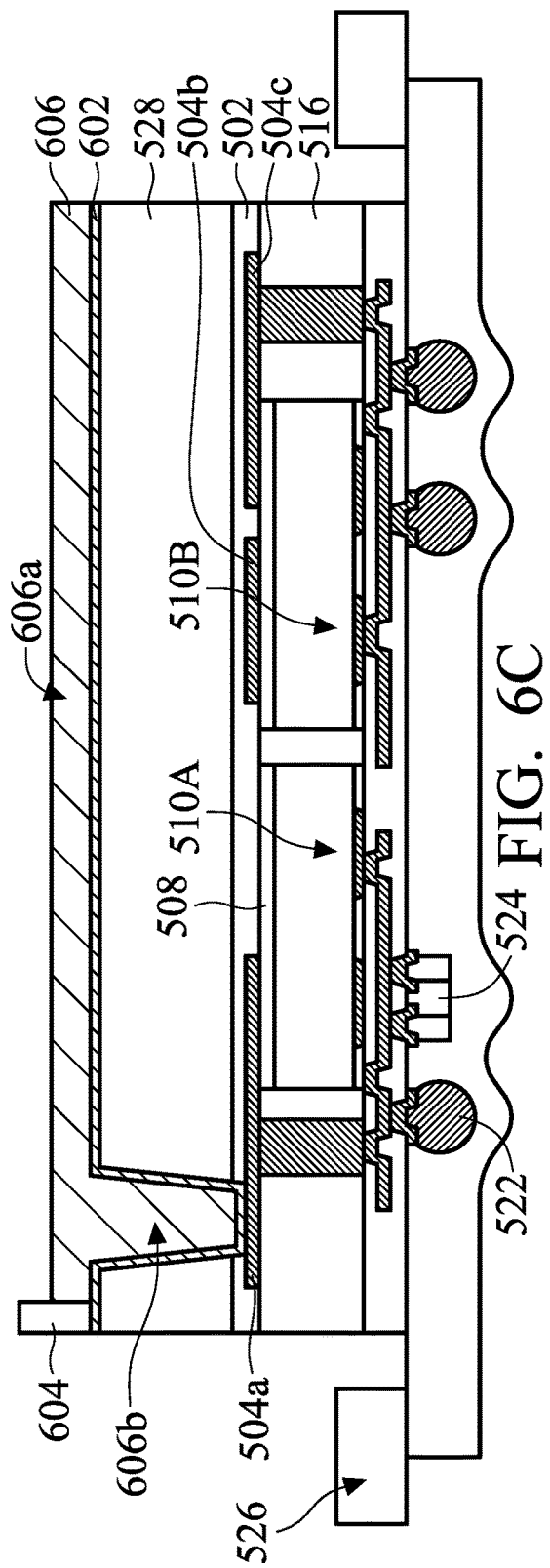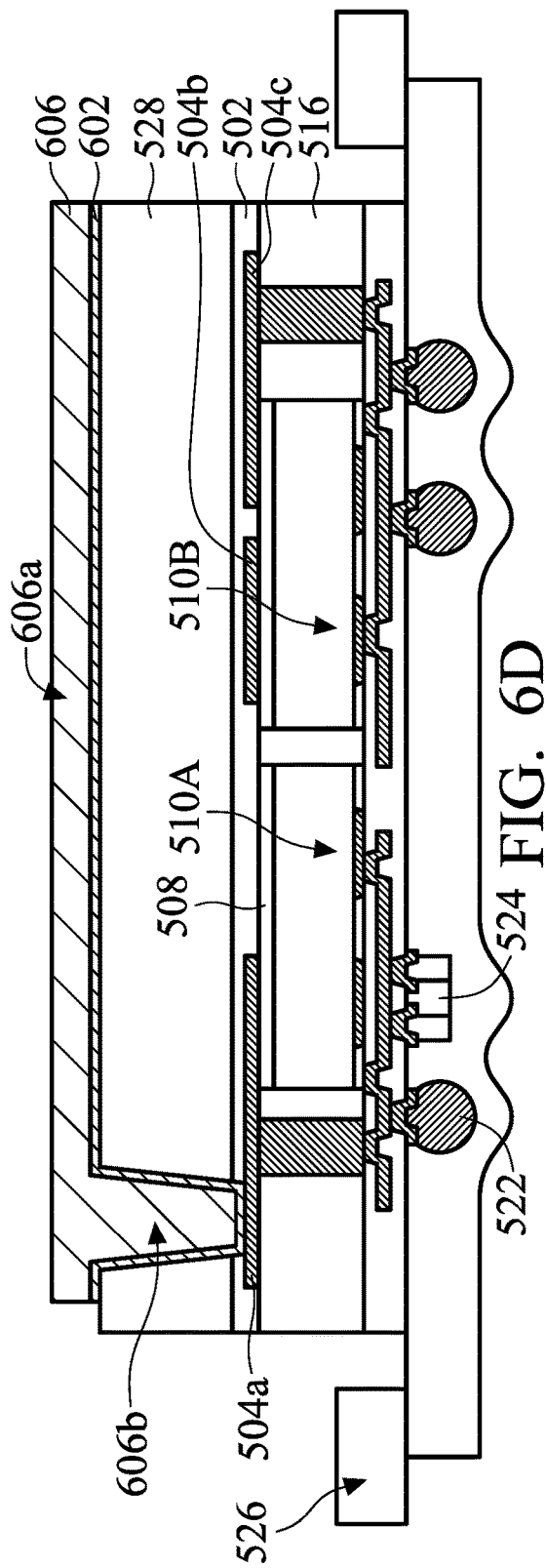

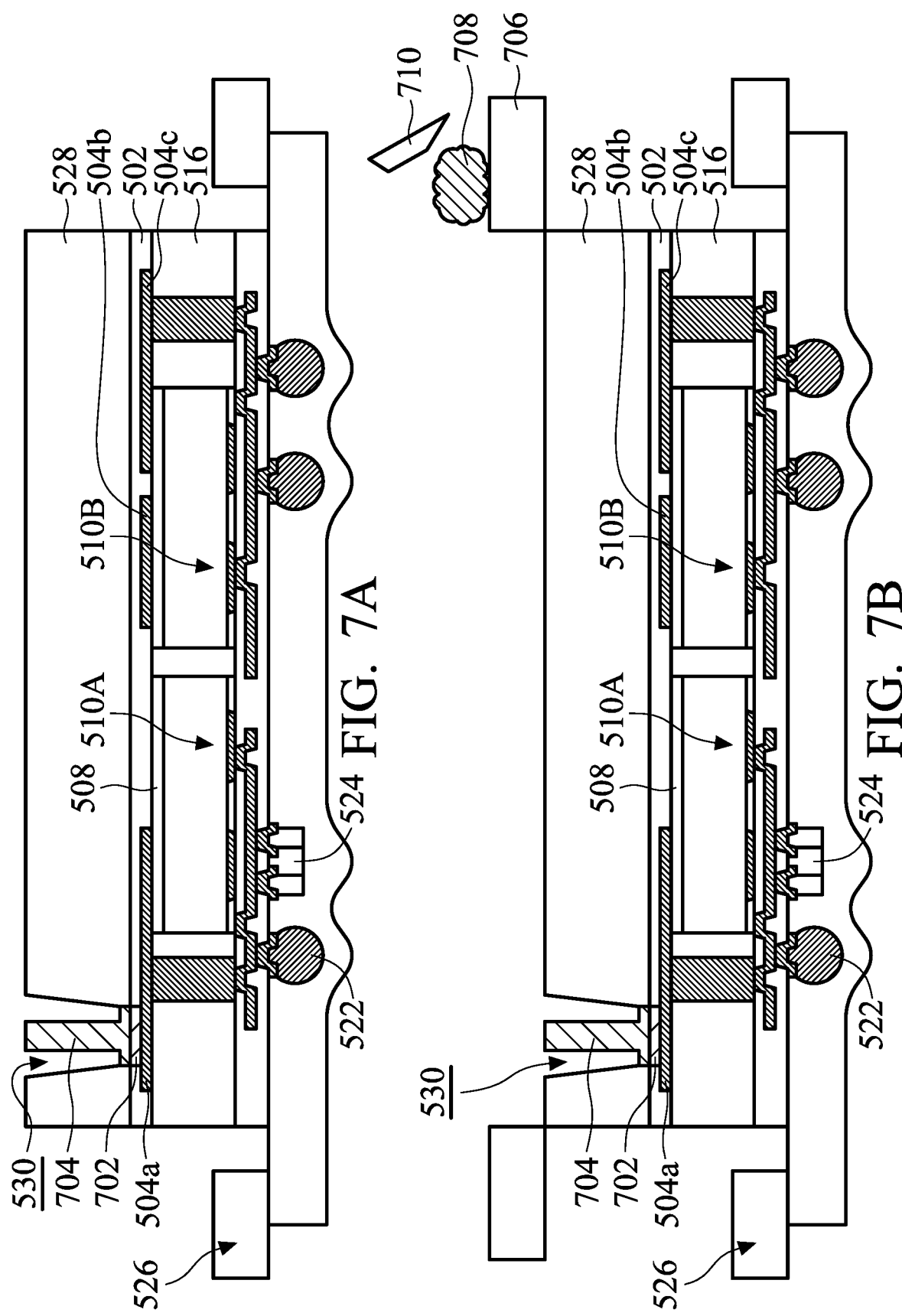

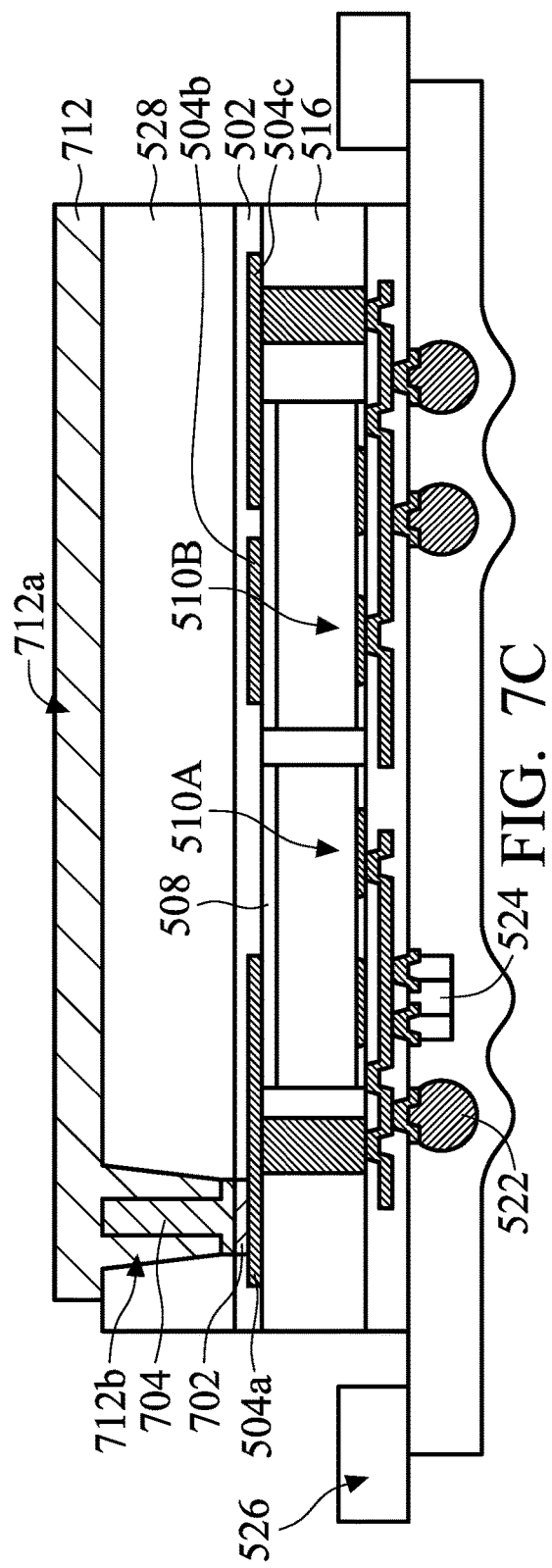
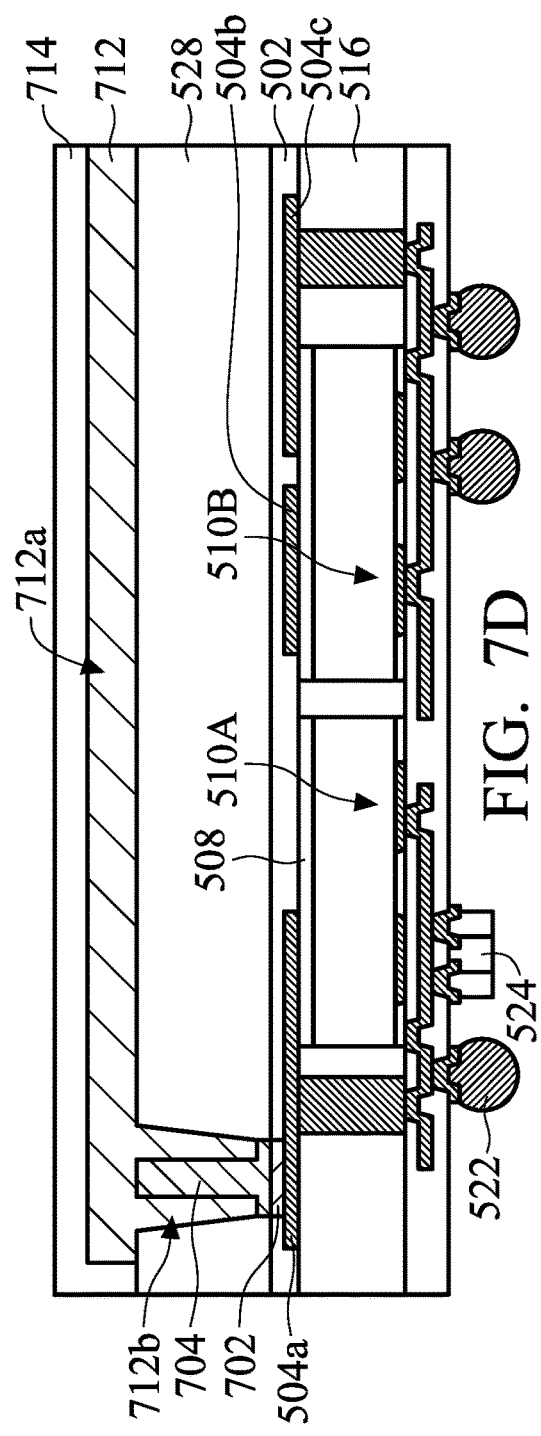
FIG. 7C
FIG. 7D

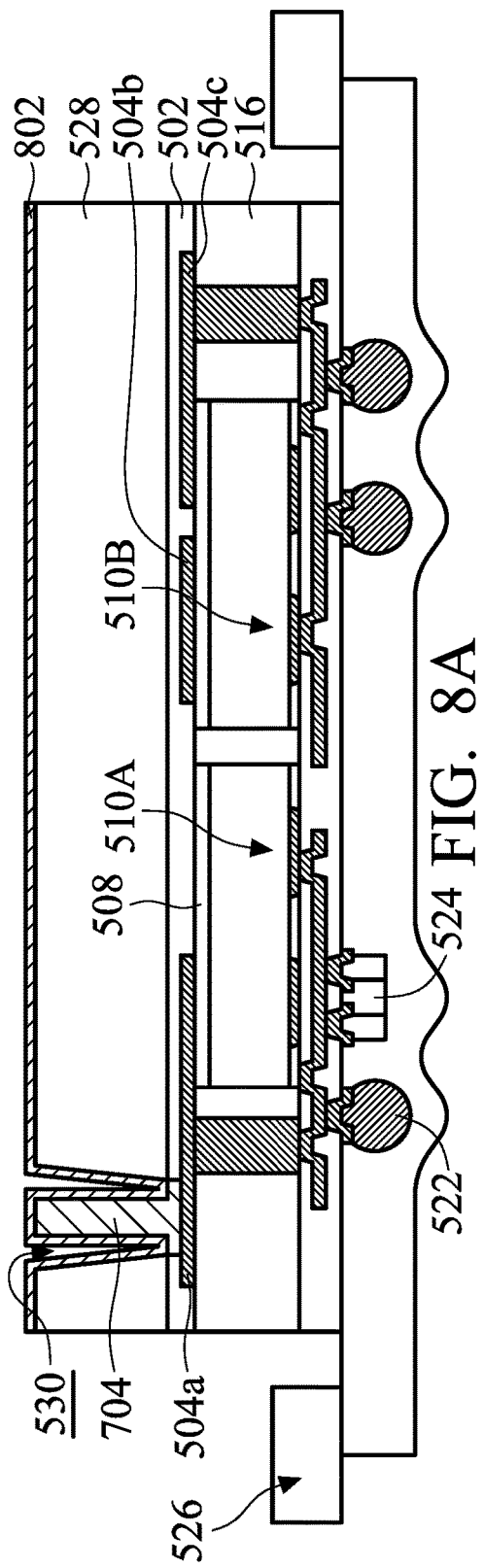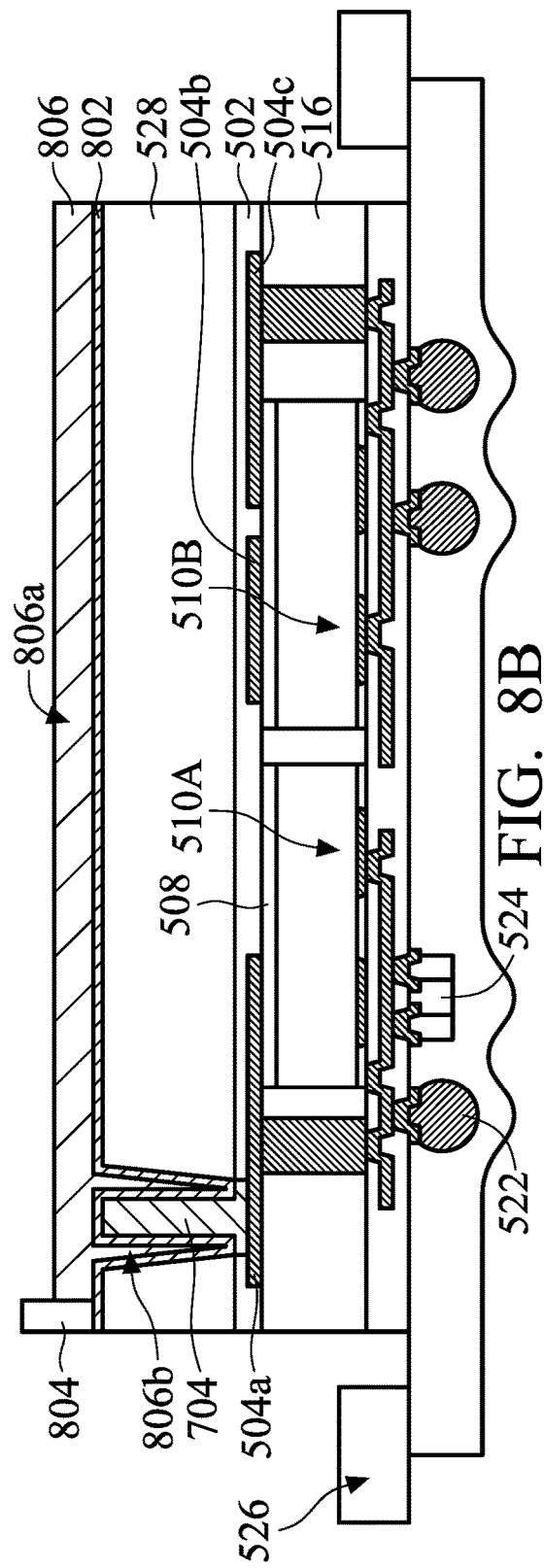

CHIP PACKAGE WITH ANTENNA ELEMENT

PRIORITY CLAIM AND CROSS-REFERENCE

This application is a Continuation application of U.S. patent application Ser. No. 16/426,365, filed on May 30, 2019, which is a Divisional of U.S. application Ser. No. 15/625,678, filed on Jun. 16, 2017 (now U.S. Pat. No. 10,312,203 issued on Jun. 4, 2019), which claims the benefit of U.S. Provisional Application No. 62/433,436, filed on Dec. 13, 2016, the entirety of which are incorporated by reference herein.

BACKGROUND

Semiconductor devices are used in a variety of electronic applications, such as personal computers, cell phones, digital cameras, and other electronic equipment. The fabrication of the semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, which utilize less area or have lower heights, are developed to package the semiconductor devices.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2 is a cross-sectional view of a chip package, in accordance with some embodiments.

FIG. 3 is a cross-sectional view of a chip package, in accordance with some embodiments.

FIGS. 5A-5J are cross-sectional views of various stages of a process for forming a chip package, in accordance with some embodiments.

FIGS. 6A-6E are cross-sectional views of various stages of a process for forming a chip package, in accordance with some embodiments.

FIGS. 7A-7D are cross-sectional views of various stages of a process for forming a chip package, in accordance with some embodiments.

FIGS. 8A-8C are cross-sectional views of various stages of a process for forming a chip package, in accordance with some embodiments.

DETAILED DESCRIPTION

Figure 1A:
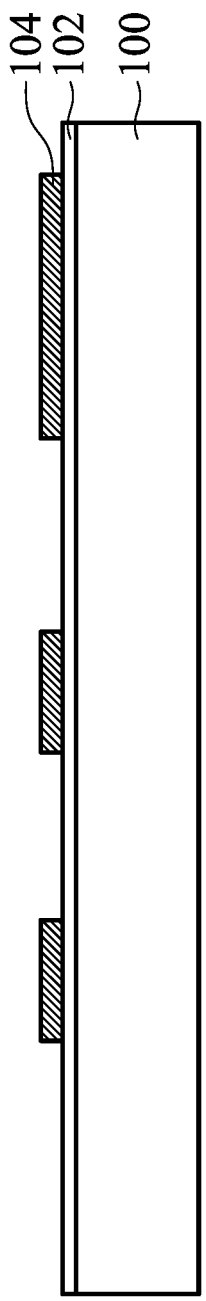
FIGS. 1A-1J are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may be applied in 3D packaging or 3D IC devices. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1J are cross-sectional views of various stages of a process for forming a chip package, in accordance with some embodiments. As shown in FIG. 1A, a passivation layer 102 is formed over a support substrate 100, in accordance with some embodiments. The support substrate 100 may include a glass substrate, a semiconductor substrate, a metal substrate, an insulating substrate, one or more other suitable substrates, or a combination thereof.

The passivation layer 102 may be used to protect elements that will be formed over the passivation layer 102. In some embodiments, the passivation layer 102 has a substantially planar top surface 102a. The passivation layer 102 may be made of or include a polymer material. The polymer material may be made of or include polyimide, epoxy-based resin, polybenzoxazole (PBO), another suitable polymer material, or a combination thereof. In some other embodiments, the passivation layer 102 is made of or includes silicon nitride, silicon oxide, silicon oxynitride, silicon carbide, another suitable dielectric material, or a combination thereof.

In some embodiments, the passivation layer 102 is formed using a spin-on process, a spray coating process, a chemical vapor deposition (CVD) process, a physical vapor deposition (PVD) process, another applicable process, or a combination thereof.

As shown in FIG. 1A, antenna elements 104 are formed over the passivation layer 102, in accordance with some embodiments. The antenna elements 104 are used to receive and/or transmit electromagnetic signals. In some embodiments, because the antenna elements 104 are formed over the substantially planar top surface of the passivation layer 102, the antenna elements 104 have substantially planar top surfaces accordingly. Because the antenna elements 104 have low surface roughness, the performance of the antenna elements 104 is improved. For example, the skin effect of the antenna elements 104 is prevented or reduced.

Figure 9:
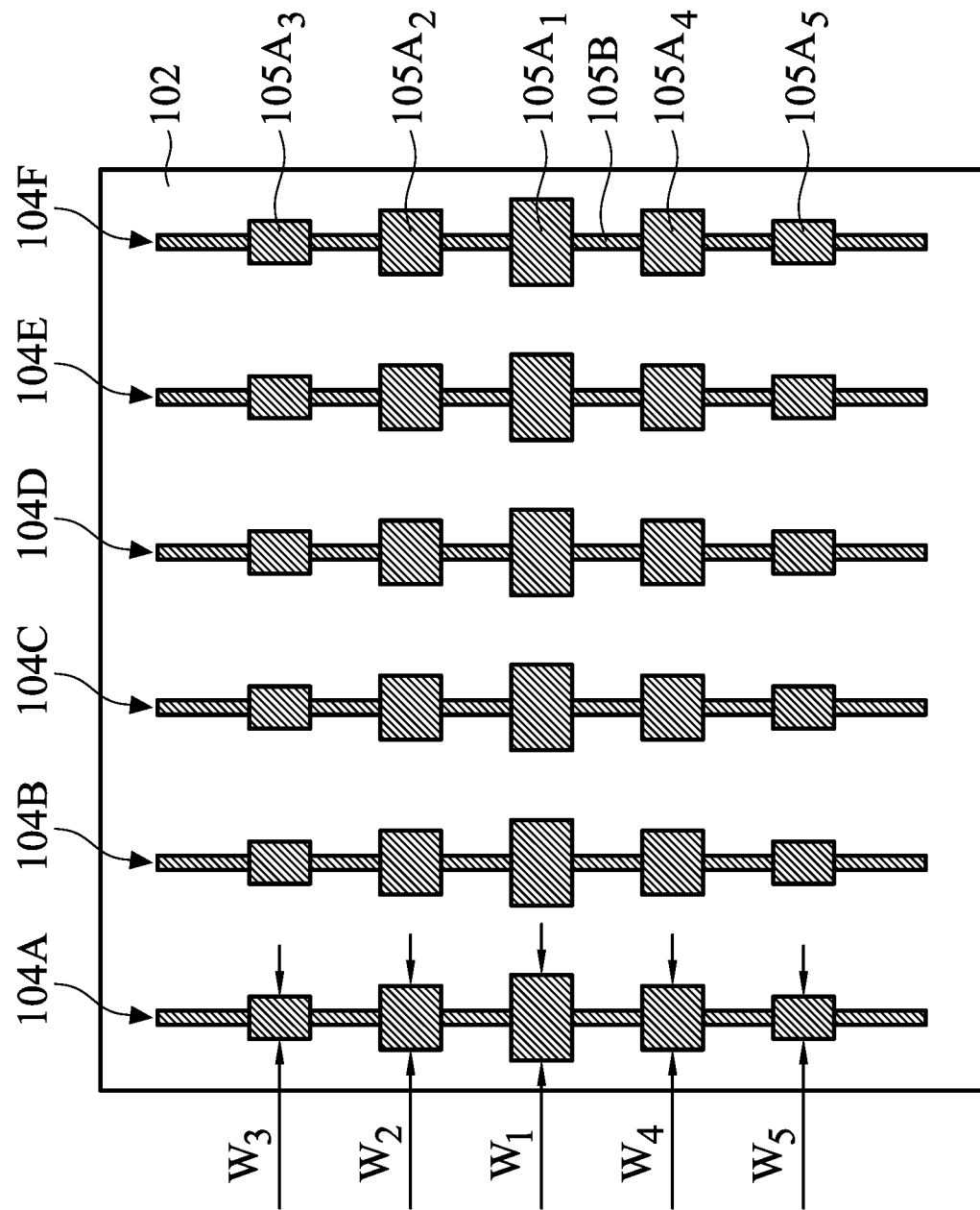
FIG. 9 is a top view of an antenna element of a chip package, in accordance with some embodiments.

FIG. 9 is a top view of an antenna element of a chip package, in accordance with some embodiments. In some embodiments, FIG. 9 is the top view of the structure shown in FIG. 1A.

In some embodiments, there are multiple antenna elements including antenna elements 104A-104F formed over the passivation layer 102, as shown in FIG. 9. In some embodiments, each of the antenna elements 104A-104F includes multiple main portions $105A_1$-$105A_5$ that are linked together through linking portions 105B between these main portions $105A_1$-$105A_5$. In some embodiments, widths (or areas) of the main portions $105A_1$-$105A_5$ are different from each other. In some embodiments, the main portion $105A_1$ has a width $W_1$ that is greater than a width $W_2$ of the main portion $105A_2$ or a width $W_4$ of the main portion $105A_4$. In some embodiments, the width $W_2$ of the main portion $105A_2$ is greater than a width $W_3$ of the main portion $105A_3$. In some embodiments, the width $W_4$ of the main portion $105A_4$ is greater than a width $W_5$ of the main portion $105A_5$. The sizes, shapes, and/or distributions of the antenna elements 104 may be adjusted and/or modified according to requirements.

In some embodiments, the antenna elements 104 are made of or include conductive materials. The antenna elements 104 may be made of or include copper, gold, aluminum, titanium, tungsten, cobalt, nickel, platinum, another suitable material, or a combination thereof. In some embodiments, the antenna elements 104 are formed using an electroplating process, an electroless plating process, a PVD process, a CVD process, another applicable process, or a combination thereof. One or more photolithography processes and etching processes may be used to achieve the formation of the antenna elements 104.

Figure 1B:
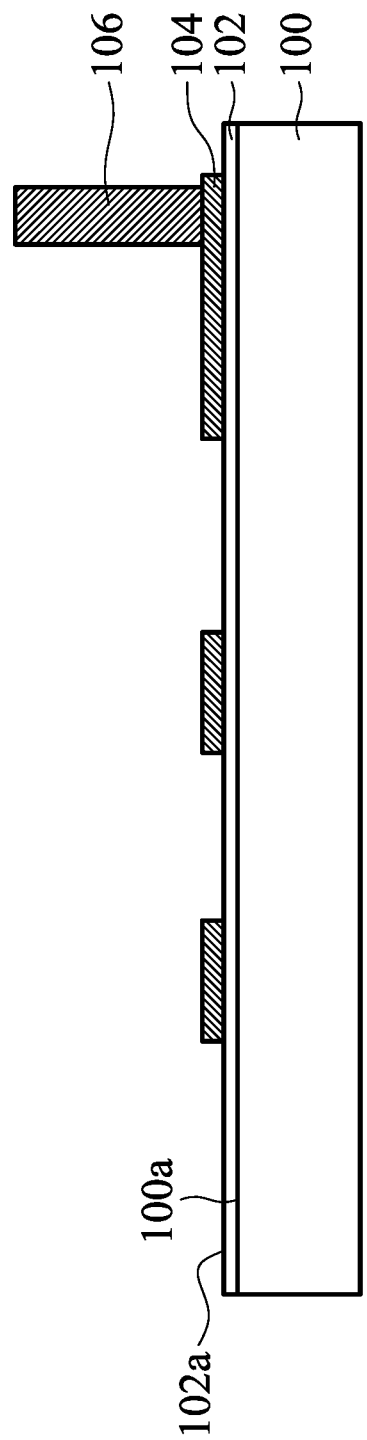

As shown in FIG. 1B, one or more conductive features 106 are formed over the antenna elements 104, in accordance with some embodiments. The conductive features 106 may be used as through insulating vias (TIVs) that establish electrical connections between the antenna elements 104 and semiconductor dies that will be disposed later.

In some embodiments, each of the conductive features 106 has a vertical sidewall that is substantially perpendicular to a main surface 100a of the support substrate 100. In some embodiments, the conductive features 106 are made of or include copper, aluminum, gold, platinum, titanium, a solder material, another suitable conductive material, or a combination thereof. In some embodiments, the conductive features 106 are formed using an electroplating process, an electroless plating process, a PVD process, a pin installation process, another applicable process, or a combination thereof. The formation of the conductive features 106 may also involve one or more photolithography processes and etching processes.

Figure 1C:
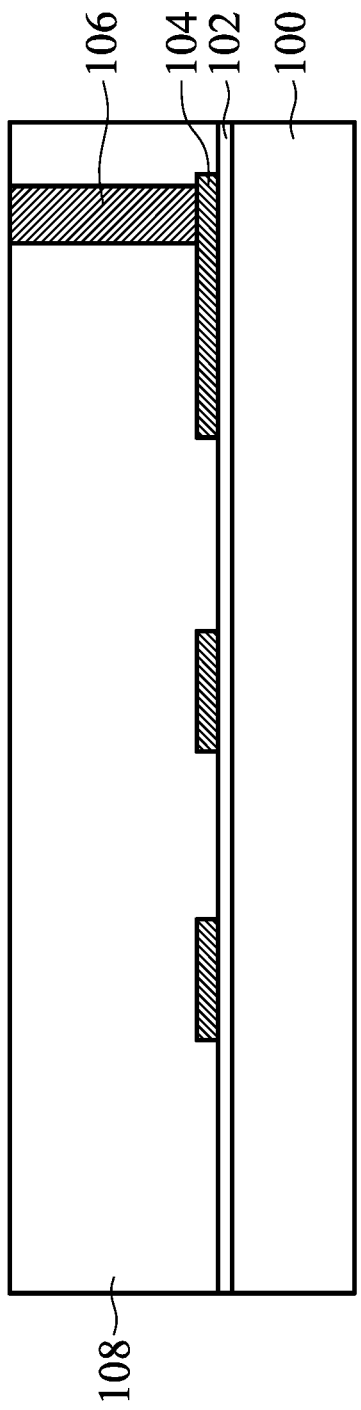

As shown in FIG. 1C, a protective layer 108 is formed over the structure shown in FIG. 1B, in accordance with some embodiments. The protective layer 108 surrounds the antenna elements 104 and the conductive features 106. In some embodiments, there is no semiconductor die formed and/or positioned between the top surface and the bottom surface of the protective layer 108.

In some embodiments, the protective layer 108 is made of or includes a molding compound material. The molding compound material may include an epoxy-based resin with fillers dispersed therein. The fillers may include insulating fibers, insulating particles, other suitable elements, or a combination thereof. For example, the fillers include or are made of silicon oxide, silicon nitride, silicon carbide, carbon-containing polymer materials, other suitable materials, or a combination thereof. In some embodiments, the protective layer 108 is formed using a transfer molding process, a compression process, an immersion process, another applicable process, or a combination thereof.

In some embodiments, a planarization process is used to thin down the protective layer 108 until the conductive features 106 are exposed. The planarization process may include a grinding process, a chemical mechanical polishing (CMP) process, an etching process, another applicable process, or a combination thereof. In some other embodiments, the planarization process is not performed. For example, the protective layer 108 is formed using a transfer molding process. By using the transfer molding process, the top surfaces of the conductive features 106 are not covered by the protective layer 108 during the formation of the protective layer 108. Therefore, it may be not necessary to perform a planarization process to expose the conductive features 106.

In some embodiments, the antenna elements 104 are used to receive or transmit electromagnetic signals that have a wavelength. In some embodiments, the protective layer 108 has a thickness that is in a range from about 0.01 times the wavelength to about 0.25 times the wavelength. In some embodiments, the protective layer 108 has a thickness greater than 50 μm. In some other embodiments, the thickness of the protective layer 108 is in a range from about 10 μm to about 2500 μm.

Figure 1D:
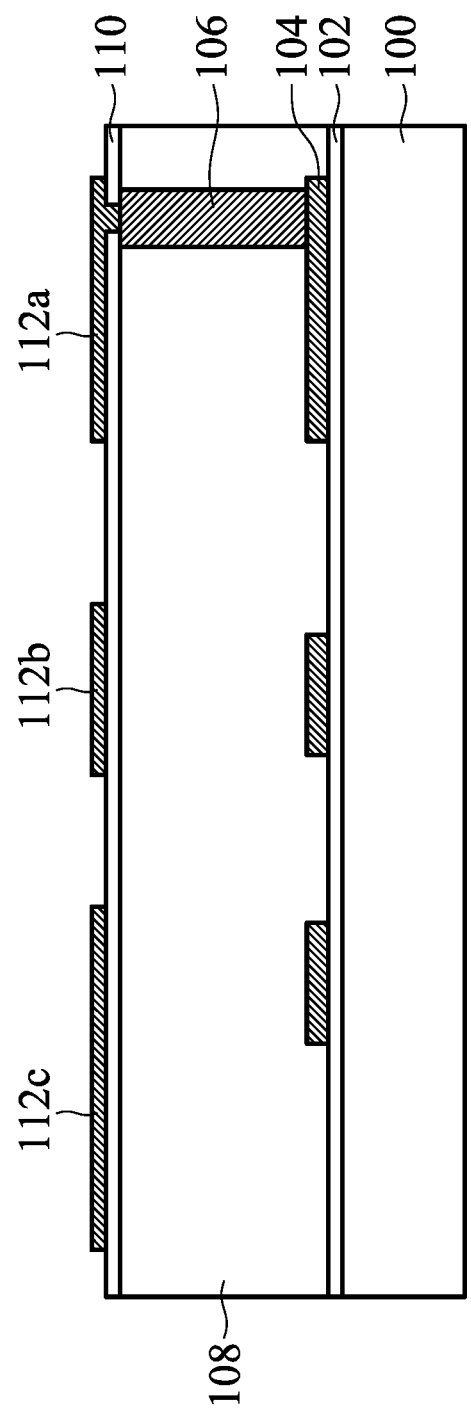

As shown in FIG. 1D, a dielectric layer 110 is deposited over the protective layer 108 and the conductive features 106, in accordance with some embodiments. In some embodiments, the dielectric layer 110 is patterned to form one or more openings that expose the conductive features 106.

Afterwards, conductive elements including conductive elements 112a, 112b, and 112c are formed over the dielectric layer 110, as shown in FIG. 1D in accordance with some embodiments. In some embodiments, the conductive element 112a is electrically connected to one of the antenna elements 104 through one of the conductive features 106. In some embodiments, the conductive elements 112b and 112c are used as shielding elements. In some embodiments, the conductive elements 112b or 112c are electrically isolated from the conductive element 112a. In some embodiments, the conductive element 112b or 112c serving as a shielding element has a greater width than that of the antenna element 104 directly below the conductive element 112b or 112c. In some embodiments, the shielding element is grounded after subsequent elements are formed. The conductive element (shielding element) 112b or 112c may be used to prevent undesired interactions between the antenna elements 104 and semiconductor dies that will be disposed later.

Many variations and/or modifications can be made to embodiments of the disclosure. In some other embodiments, one of the conductive elements 112b and 112c is not used as a shielding element and is electrically connected to one of the antenna elements 104 through one of the conductive features 106 (not shown in FIG. 1D).

In some embodiments, the conductive elements 112a, 112b, and 112c are made of or include copper, aluminum, gold, titanium, cobalt, platinum, tin, another suitable material, or a combination thereof. In some embodiments, the conductive elements 112 are formed using an electroplating process, an electroless plating process, a PVD process, a CVD process, another applicable process, or a combination thereof. The formation of the conductive elements 112 may also involve one or more photolithography processes and etching processes.

Figure 1E:
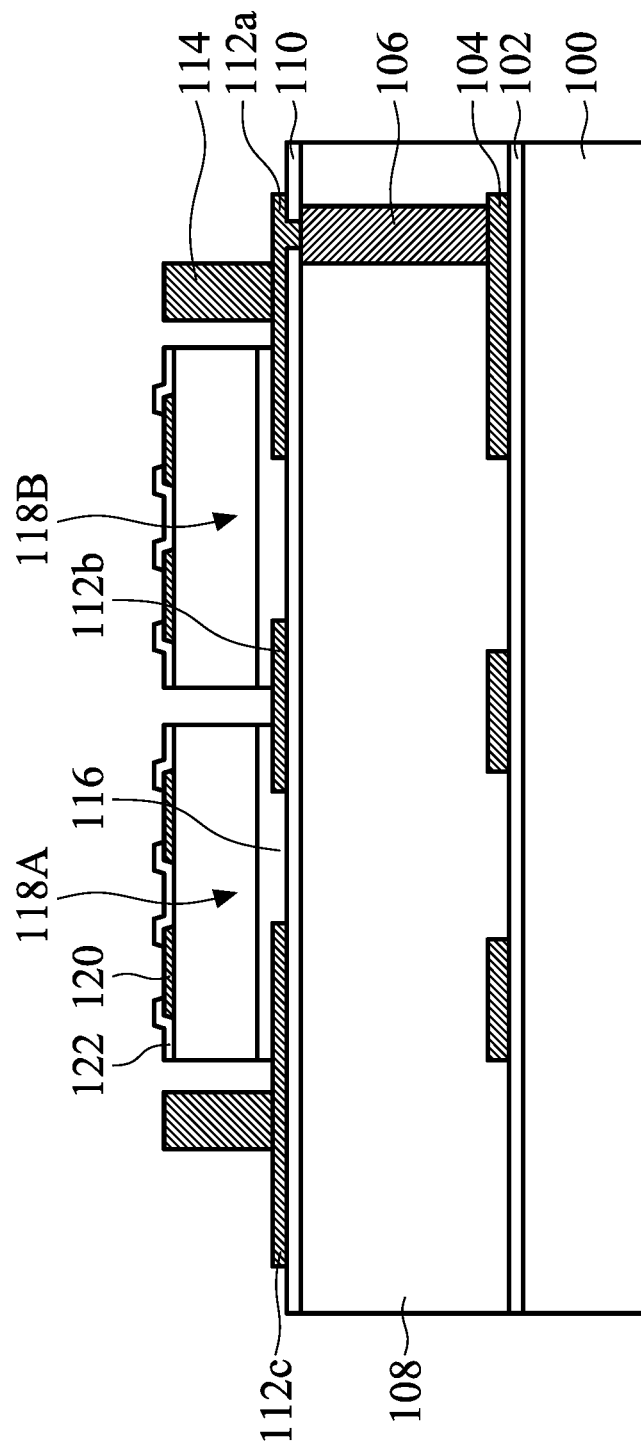

As shown in FIG. 1E, conductive features 114 are formed over the conductive elements 112, in accordance with some embodiments. In some embodiments, the material and formation method of the conductive features 114 are similar to or the same as those of the conductive features 106. In some embodiments, one of the conductive features 114 is electrically connected to the conductive element 112a that is electrically connected to one of the antenna elements 104. In some embodiments, one of the conductive features 114 is electrically connected to the conductive element 112c that is used as a shielding element.

As shown in FIG. 1E, semiconductor dies 118A and 118B are placed over the conductive elements 112a, 112b, and/or 112c and the dielectric layer 110, in accordance with some embodiments. In some embodiments, an adhesive film 116 is used to affix the semiconductor dies 118A and 118B on the conductive elements 112a, 112b, and/or 112c. Each of the semiconductor dies 118A and 118B includes multiple conductive elements 120, such as conductive pads. Each of the semiconductor dies 118A and 118B may include a passivation layer 122 partially covering the conductive elements 120. In some embodiments, the semiconductor die 118B includes a radio-frequency integrated circuit (RFIC). In some embodiments, the semiconductor die 118A includes a micro-controller.

Figure 1F:
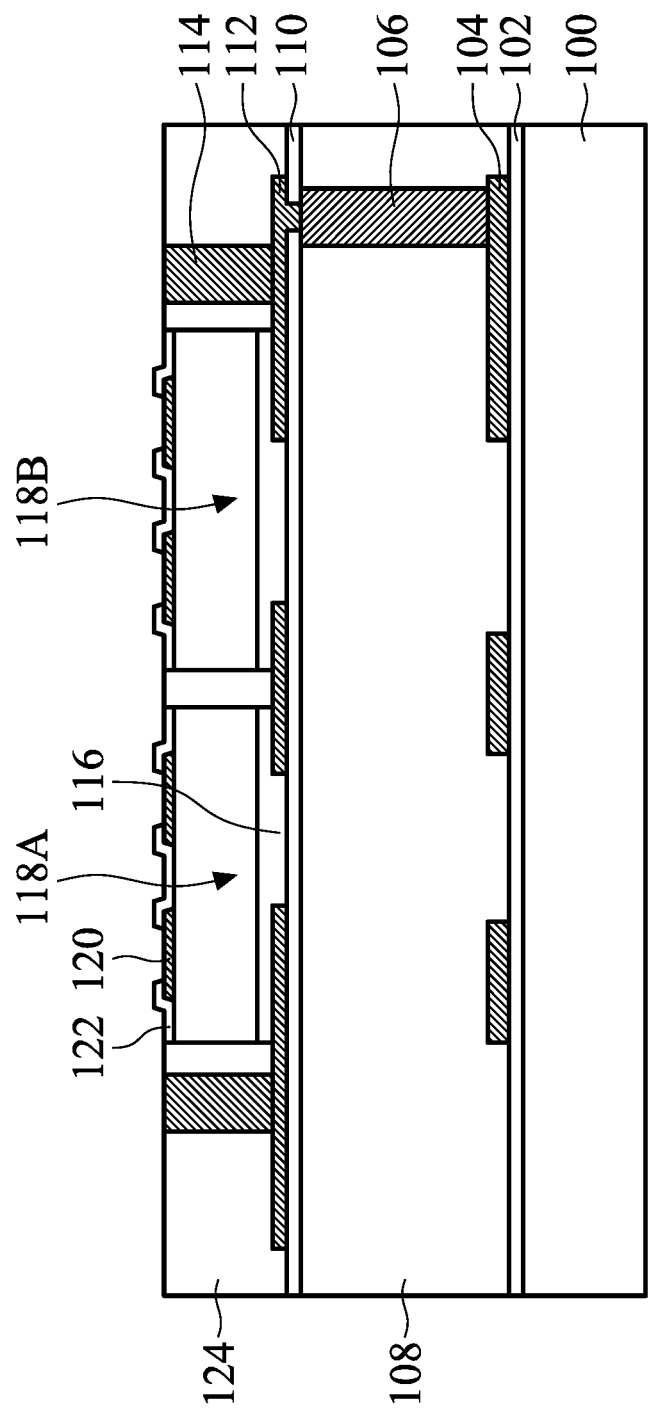

As shown in FIG. 1F, a protective layer 124 is formed over the structure shown in FIG. 1E, in accordance with some embodiments. The protective layer 124 surrounds the conductive features 114 and the semiconductor dies 118A and 118B. In some embodiments, the protective layer 124 is made of or includes a molding compound material. The molding compound material may include an epoxy-based resin with fillers dispersed therein. In some embodiments, the protective layer 124 is formed using a transfer molding process, a compression process, an immersion process, another applicable process, or a combination thereof.

In some embodiments, a planarization process is used to thin down the protective layer 124 until the conductive features 114 and the conductive elements 120 of the semiconductor dies 118A and 118B are exposed. The planarization process may include a grinding process, a CMP process, an etching process, another applicable process, or a combination thereof. In some other embodiments, the planarization process is not performed. For example, the protective layer 124 is formed using a transfer molding process where the top surfaces of the conductive features 114 and the conductive elements 120 of the semiconductor dies 118A and 118B are not covered by the protective layer 124.

In some embodiments, the material of the protective layer 124 is different from that of the protective layer 108. In some embodiments, the protective layer 108 has a lower dielectric constant than that of the protective layer 124. In some embodiments, the protective layer 108 has a lower dissipation factor (DF) than that of the protective layer 124.

Figure 1G:
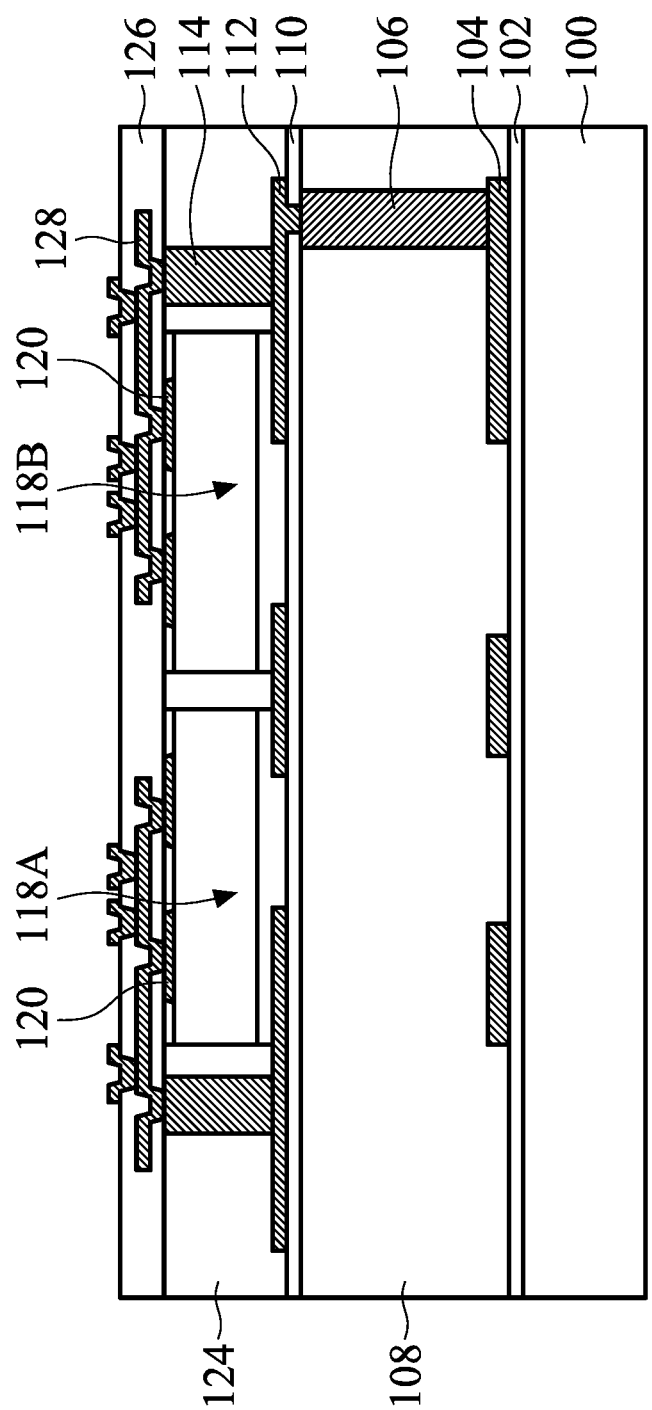

As shown in FIG. 1G, an interconnection structure is formed over the structure shown in FIG. 1F, in accordance with some embodiments. The interconnection structure includes multiple dielectric layers 126 and multiple conductive features 128. The formation of the interconnection structure may include multiple deposition processes and patterning processes. After the interconnection structure is formed, electrical connections between the semiconductor dies (such as the semiconductor die 118B) and one or more of the antenna elements 104 are formed. In some embodiments, one of the conductive elements 120 of the semiconductor die 118B is electrically connected to one of the antenna elements 104 through the conductive features 128 and 114, the conductive element 112, and the conductive feature 106. In some other embodiments, one of the conductive elements 120 of the semiconductor die 118B is electrically connected to two or more of the antenna elements 104 through the interconnection structure. In some other embodiments, two or more of the conductive elements 120 of the semiconductor die 118B are electrically connected to the antenna elements 104. For example, each of the conductive elements 120 of the semiconductor die 118B is electrically connected to a corresponding one of the antenna elements 104 through the interconnection structure. In some other embodiments, some of the conductive elements 120 of the semiconductor die 118B are not electrically connected to the antenna elements 104. For example, some of the conductive elements 120 are electrically connected to another semiconductor die (such as the semiconductor die 118A) through the interconnection structure.

Figure 1H:
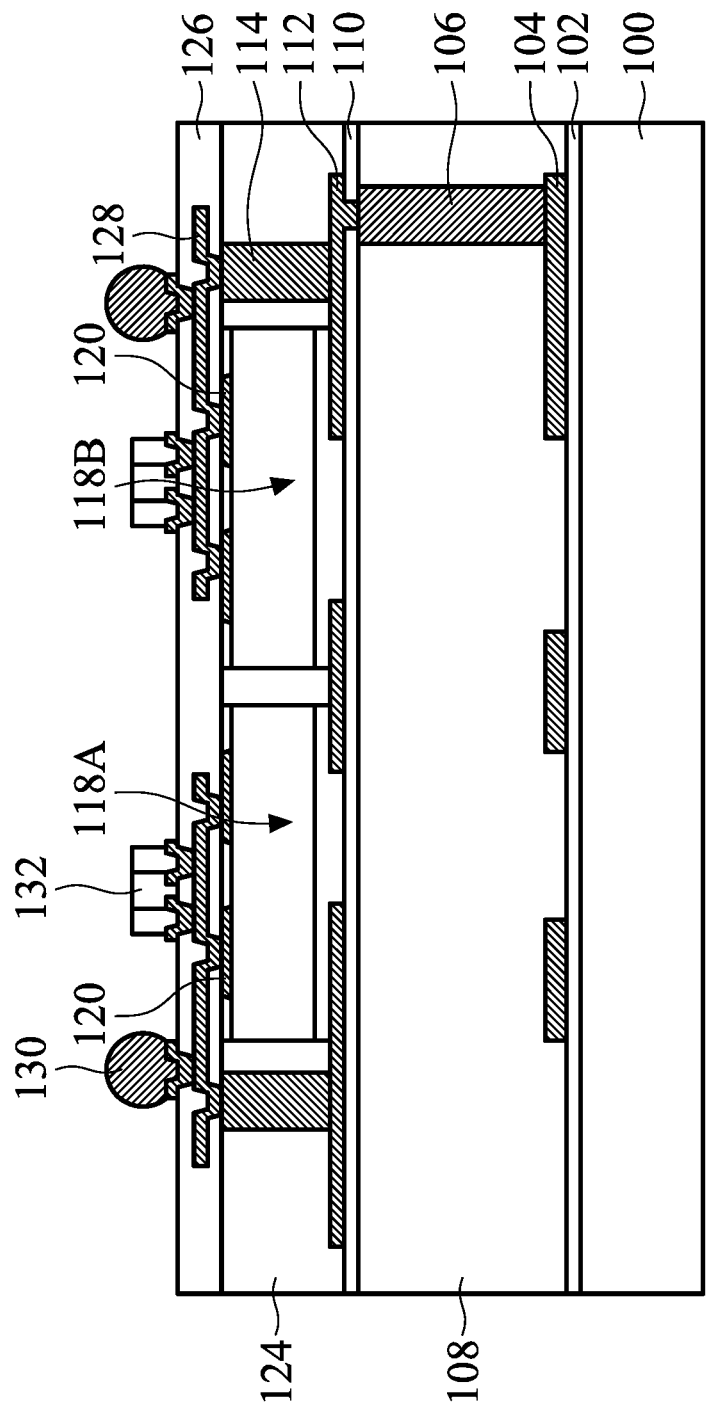

As shown in FIG. 1H, conductive bumps 130 are formed over some of the conductive features 128, in accordance with some embodiments. In some embodiments, the conductive bumps 130 include solder bumps. The solder bumps are made of tin and other metal materials. The conductive bumps 130 may include metal pillars such as copper pillars in some embodiments. Afterwards, surface mounting devices 132 are placed on some of the conductive features 128, as shown in FIG. 1H in accordance with some embodiments. The surface mounting devices 132 may include passive devices, such as capacitors, resistors, and/or inductors.

Figure 1I:
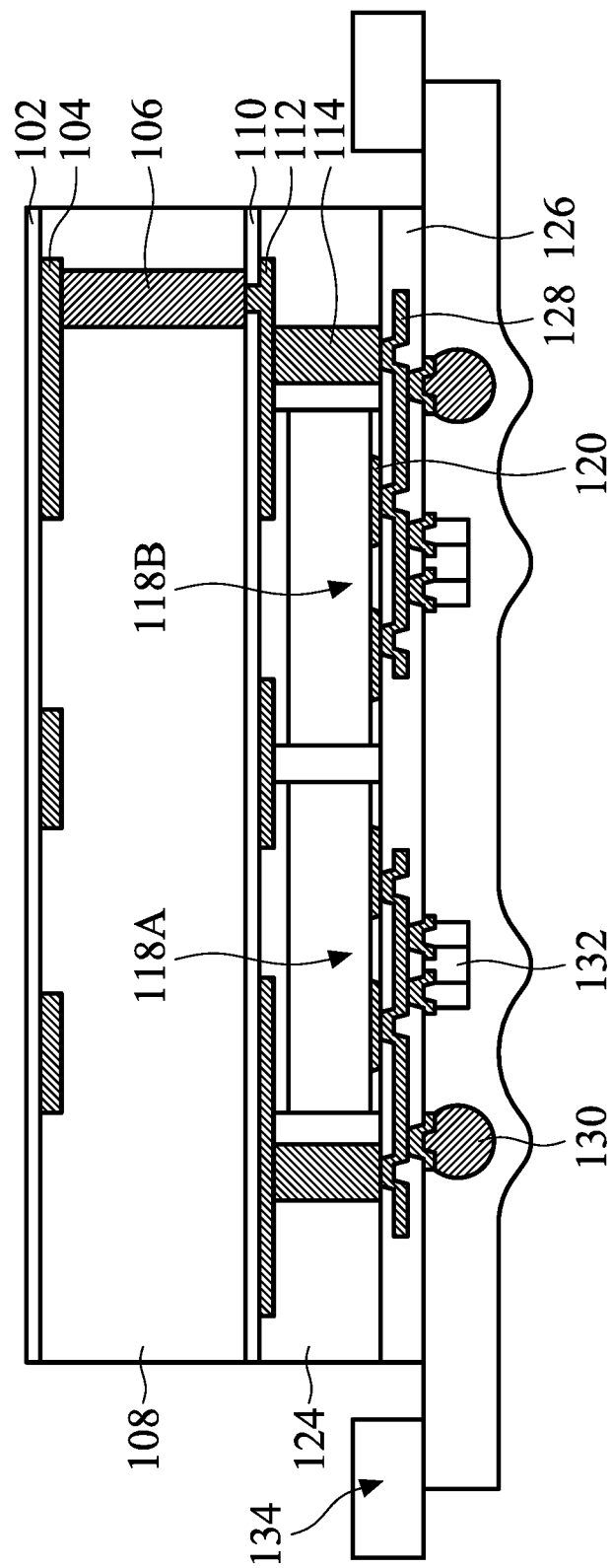

As shown in FIG. 1I, the structure shown in FIG. 1H is placed upside down and disposed on a tape frame 134, in accordance with some embodiments. Afterwards, the support substrate 100 is removed. In some embodiments, a dicing operation is performed to obtain multiple chip packages. However, embodiments of the disclosure are not limited thereto. In some other embodiments, the support substrate 100 is not removed.

Figure 1J:
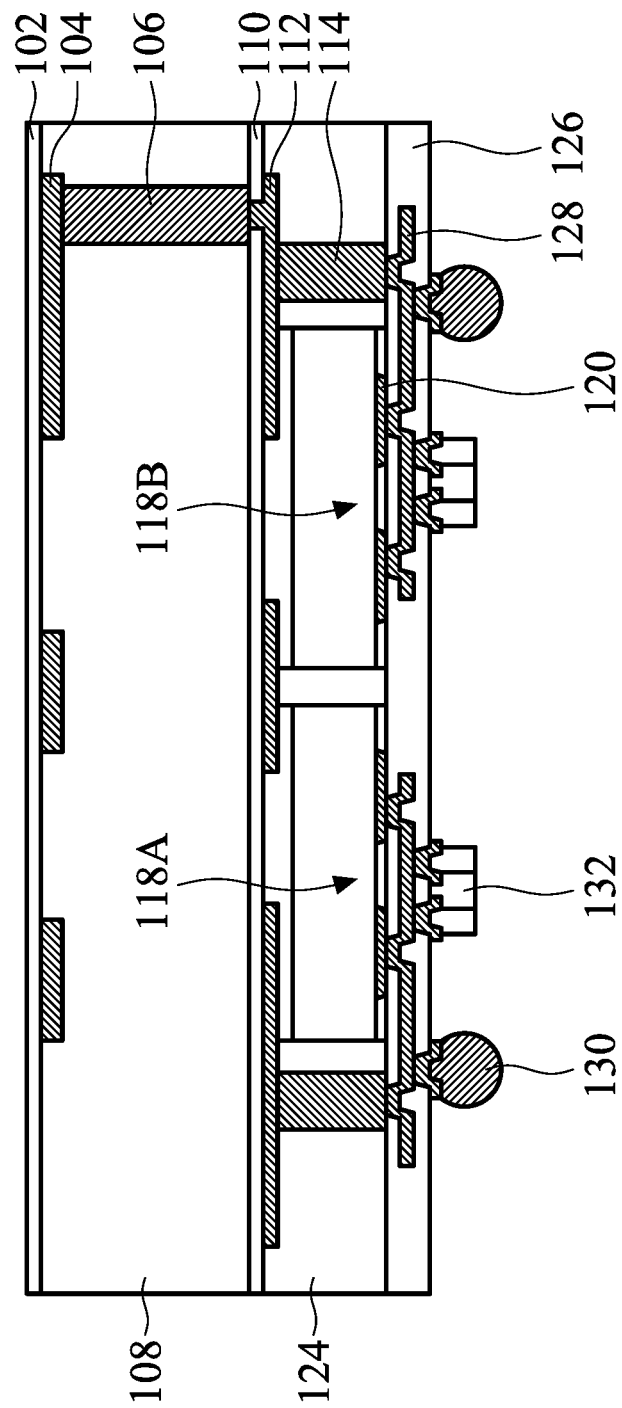

Afterwards, the tape frame 134 is removed, as shown in FIG. 1J in accordance with some embodiments, where one of the chip packages is shown.

In the embodiments as shown in FIG. 1J, the antenna elements 104 are stacked over the semiconductor dies 118B and 118A. Electrical connections between the antenna elements 104 and the semiconductor dies 118B and/or 118A are formed through vertical conductive features such as conductive features 106 and 114. In some other cases where antenna elements and the semiconductor die are disposed on the same plane (such as on the same substrate), a relatively large area may be needed for forming the electrical connections therebetween. In some embodiments, because electrical connections between the antenna elements 104 and the semiconductor die 118B and/or 118A occupy a relatively small area, the size of the chip package may be reduced further. The antenna elements 104 of the chip package may perform better. For example, lower signal loss and/or lower power dissipation may be achieved.

In the embodiments shown in FIG. 1J, the conductive features 114 and 106 are not arranged in an aligned manner. In some embodiments, a direct projection of the conductive feature 114 on the top surface of the protective layer 108 does not overlap a direct projection of the conductive feature 106 on the top surface of the protective layer 108.

Many variations and/or modifications can be made to embodiments of the disclosure. FIG. 2 is a cross-sectional view of a chip package, in accordance with some embodiments. FIG. 2 shows a chip package similar to that shown in FIG. 1J. In some embodiments, the conductive feature 106 is substantially aligned with the conductive feature 114, as shown in FIG. 2. In some embodiments, a direct projection of the conductive feature 114 on the top surface of the protective layer 108 overlaps a direct projection of the conductive feature 106 on the top surface of the protective layer 108.

Many variations and/or modifications can be made to embodiments of the disclosure. FIG. 3 is a cross-sectional view of a chip package, in accordance with some embodiments. FIG. 3 shows a chip package similar to that shown in FIG. 1J. In some embodiments, there is only one semiconductor die (the semiconductor die 118) disposed or positioned in the protective layer 124.

Figure 4:
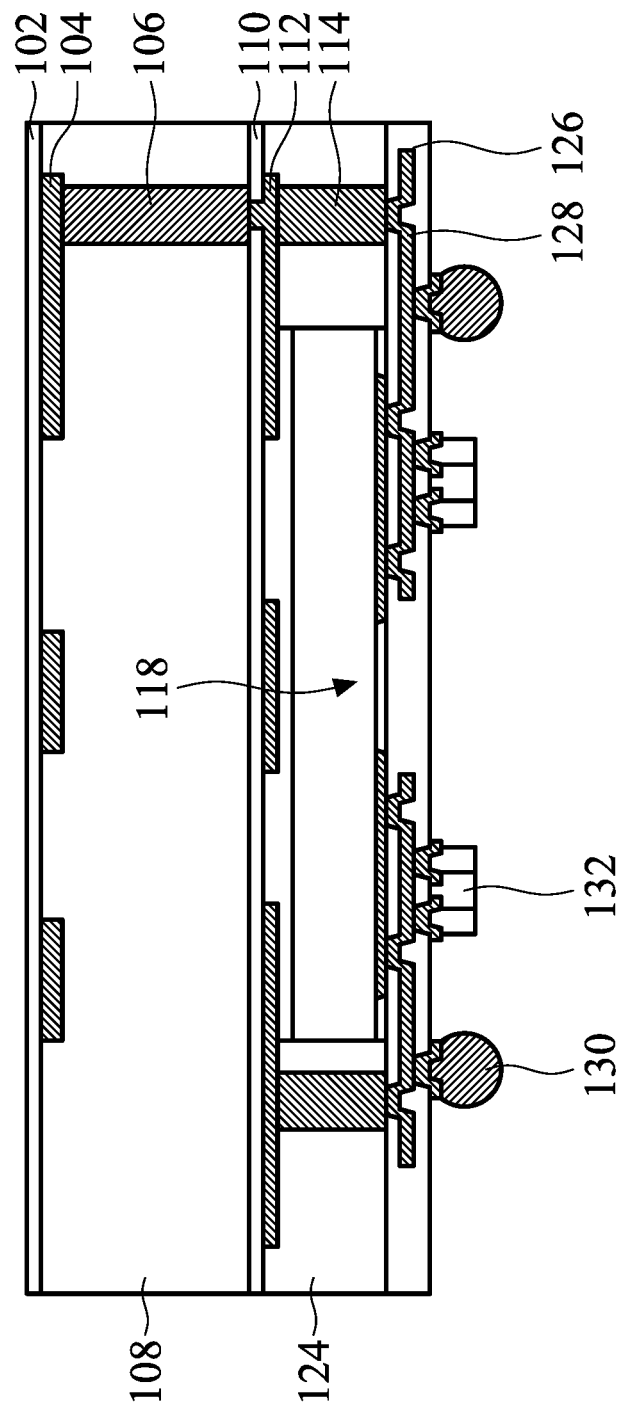
FIG. 4 is a cross-sectional view of a chip package, in accordance with some embodiments.

Many variations and/or modifications can be made to embodiments of the disclosure. FIG. 4 is a cross-sectional view of a chip package, in accordance with some embodiments. FIG. 4 shows a chip package similar to that shown in FIG. 2. In some embodiments, there is only one semiconductor die (the semiconductor die 118) formed or positioned in the protective layer 124.

In the embodiments illustrated in FIGS. 1A-1J, the antenna elements are formed before using a protective layer to surround semiconductor dies. However, embodiments of the disclosure are not limited thereto. In some other embodiments, the antenna elements are formed after using a protective layer to surround semiconductor dies.

Figure 5A:
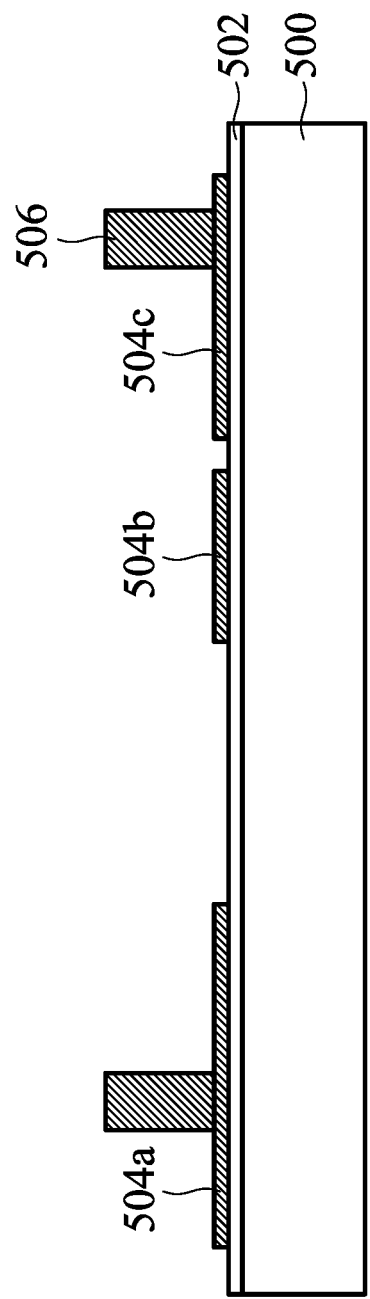

FIGS. 5A-5J are cross-sectional views of various stages of a process for forming a chip package, in accordance with some embodiments. As shown in FIG. 5A, a dielectric layer 502 is formed over a support substrate 500, in accordance with some embodiments. The support substrate 500 may be similar to or the same as the support substrate 100. The material and formation method of the dielectric layer 502 may be similar to or the same as those of the dielectric layer 110.

Afterwards, multiple conductive elements including conductive elements 504*a*, 504*b*, and 504*c* are formed over the dielectric layer 502, as shown in FIG. 5A in accordance with some embodiments. The material and formation method of the conductive elements 504*a*, 504*b*, and 504*c* may be similar to or the same as those of the conductive elements 112*a*, 112*b*, and 112*c*.

Afterwards, conductive features 506 are formed over the conductive elements (such as the conductive elements 504*a* and 504*c*), as shown in FIG. 5A in accordance with some embodiments. The material and formation method of the conductive features 506 may be similar to or the same as those of the conductive features 114.

Figure 5B:
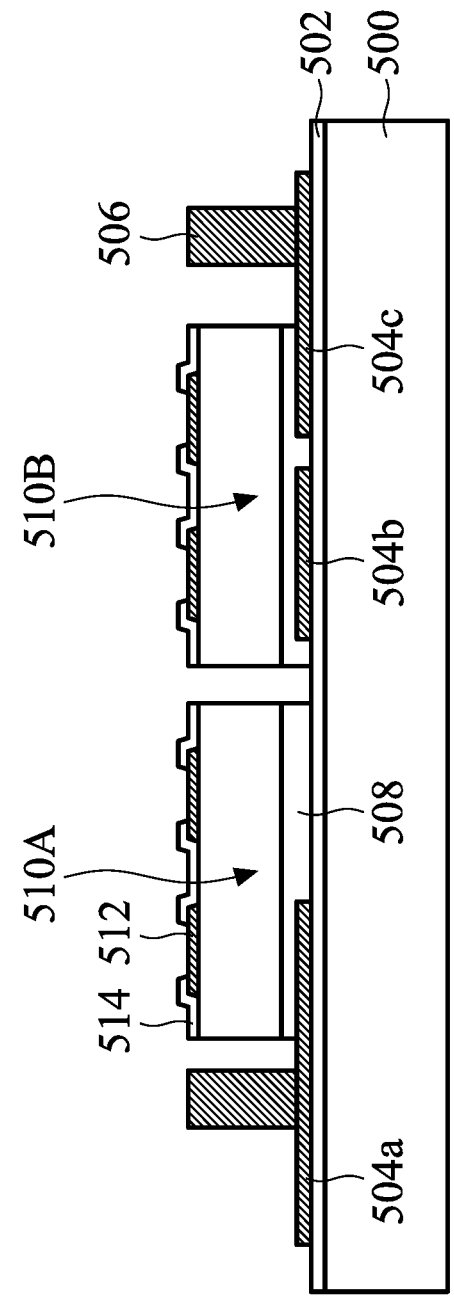

As shown in FIG. 5B, semiconductor dies 510A and 510B are placed over the conductive elements 504*a*, 504*b*, and/or 504*c*, in accordance with some embodiments. In some embodiments, an adhesive film 508 is used to affix the semiconductor dies 510A and 510B on the conductive elements 504*a*, 504*b*, and/or 504*c*. Each of the semiconductor dies 510A and 510B includes multiple conductive elements 512, such as conductive pads. Each of the semiconductor dies 510A and 510B may include a passivation layer 514 partially covering the conductive elements 512. In some embodiments, the semiconductor die 510A includes a radio-frequency integrated circuit (RFIC). In some embodiments, the semiconductor die 510B includes a micro-controller.

Figure 5C:
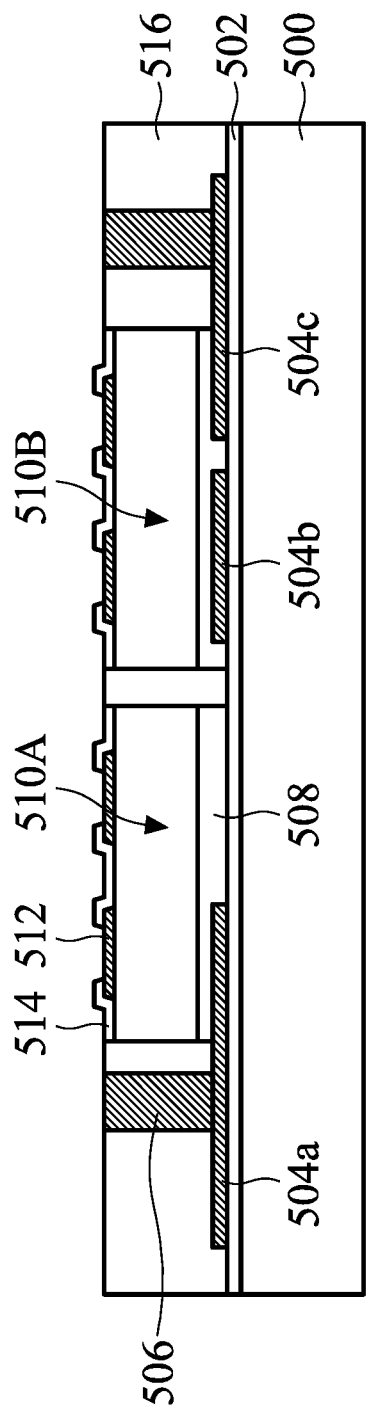

As shown in FIG. 5C, a protective layer 516 is formed over the structure shown in FIG. 5B, in accordance with some embodiments. The protective layer 516 surrounds the conductive features 506 and the semiconductor dies 510A and 510B. The material and formation method of the protective layer 516 may be similar to or the same as those of the protective layer 124.

In some embodiments, a planarization process is used to thin down the protective layer 516 until the conductive features 506 and the conductive elements 512 of the semiconductor dies 510A and 510B are exposed. The planarization process may include a grinding process, a CMP process, an etching process, another applicable process, or a combination thereof. In some other embodiments, the planarization process is not performed. For example, the protective layer 516 is formed using a transfer molding process where the top surfaces of the conductive features 506 and the conductive elements 512 of the semiconductor dies 510A and 510B are not covered by the protective layer 516.

Figure 5D:
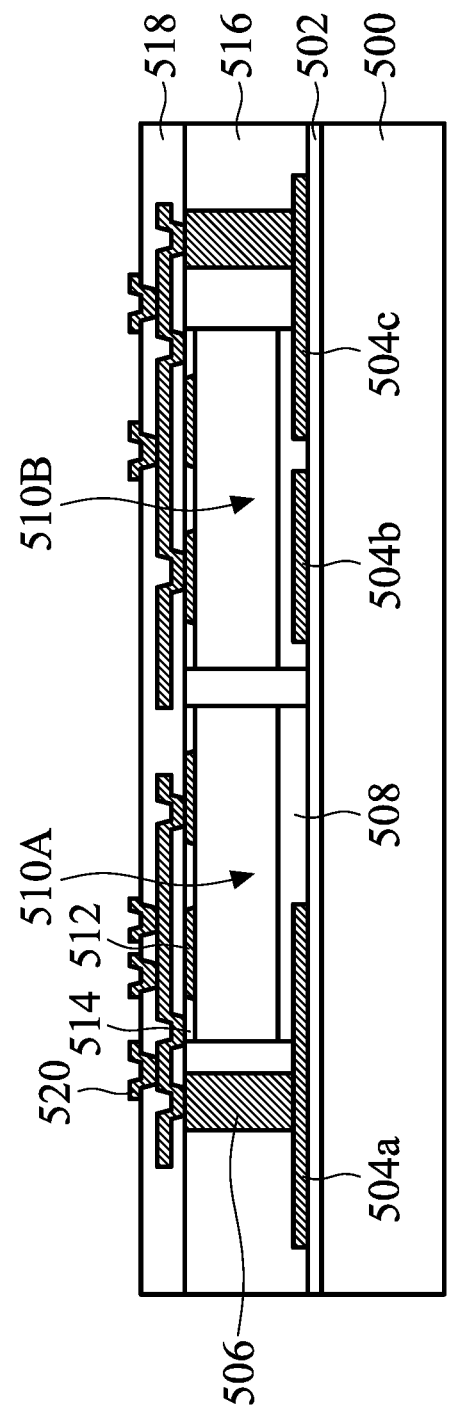

As shown in FIG. 5D, an interconnection structure is formed over the structure shown in FIG. 5C, in accordance with some embodiments. The interconnection structure includes multiple dielectric layers 518 and multiple conductive features 520. The formation of the interconnection structure may include multiple deposition processes and patterning processes.

Figure 5E:
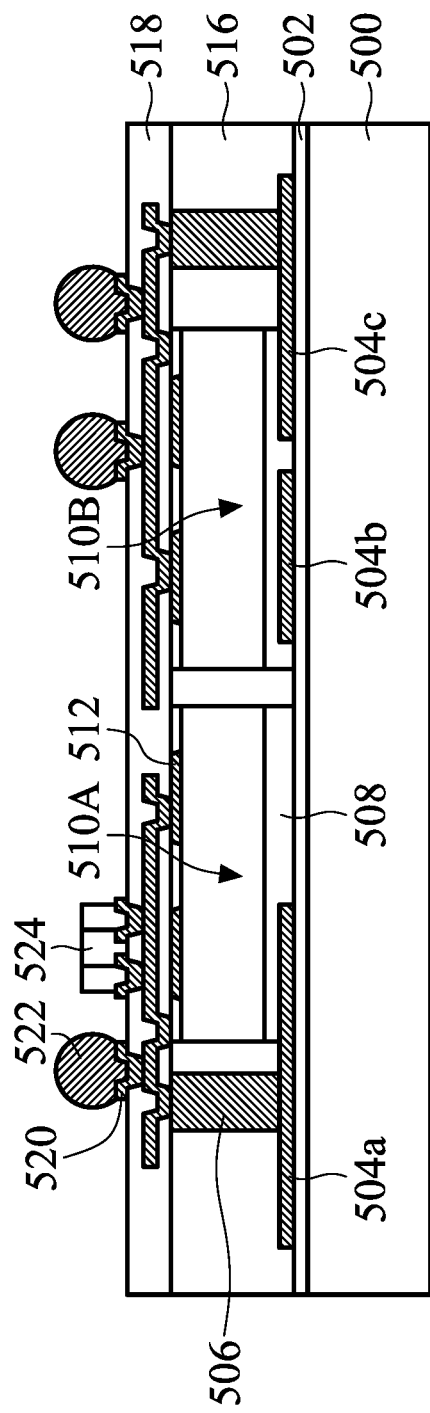

As shown in FIG. 5E, conductive bumps 522 are formed over some of the conductive features 520, in accordance with some embodiments. In some embodiments, the conductive bumps 522 include solder bumps. The solder bumps are made of tin and other metal materials. The conductive bumps 522 may include metal pillars such as copper pillars. Afterwards, surface mounting devices 524 are placed on some of the conductive features 520, as shown in FIG. 5E in accordance with some embodiments. The surface mounting devices 524 may include passive devices, such as capacitors, resistors, and/or inductors.

Figure 5F:
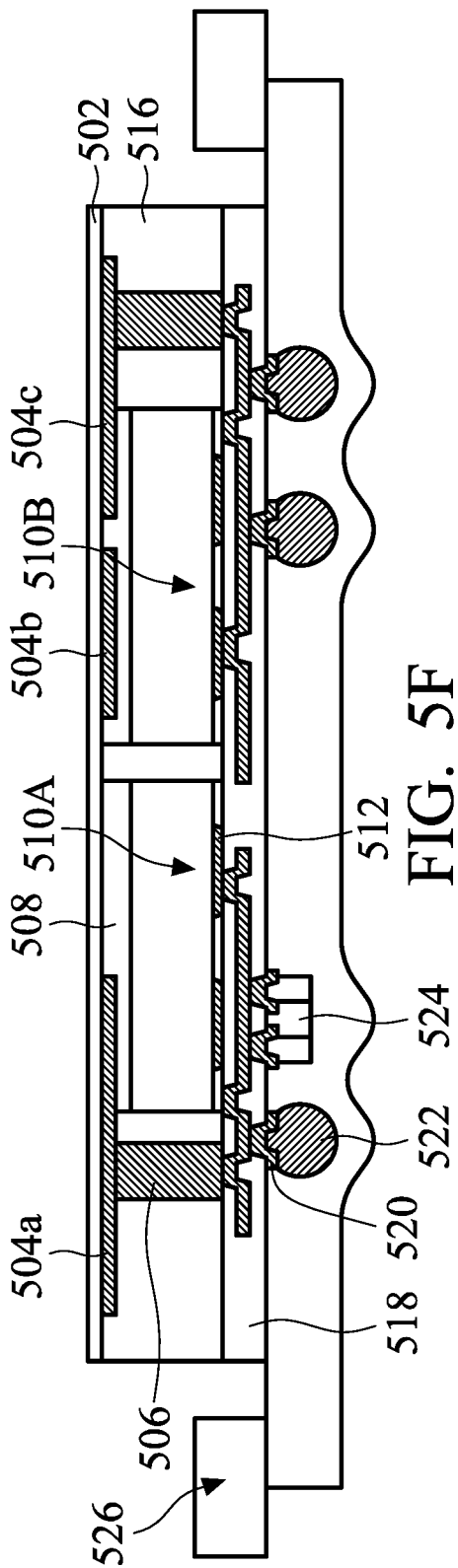

As shown in FIG. 5F, the structure shown in FIG. 5E is placed upside down and disposed on a tape frame 526, in accordance with some embodiments. Afterwards, the support substrate 500 is removed.

As shown in FIG. 5G, a protective layer 528 is formed over the dielectric layer 502, in accordance with some embodiments. The material and formation method of the protective layer 528 may be similar to or the same as those of the protective layer 108. In some embodiments, the protective layer 528 is an insulating film that is laminated or adhered on the dielectric layer 502. In some embodiments, the protective layer 528 has a substantially planar top surface.

In some embodiments, the material of the protective layer 528 is different from that of the protective layer 516. In some embodiments, the protective layer 528 has a lower dielectric constant than that of the protective layer 516. In some embodiments, the protective layer 528 has a lower dissipation factor than that of the protective layer 516.

Afterwards, one or more openings 530 are formed to expose the conductive elements including the conductive element 504a, as shown in FIG. 5G in accordance with some embodiments. In FIG. 5G, one of the openings 530 is shown. In some embodiments, the protective layer 528 and the dielectric layer 502 are partially removed to form the openings 530. In some embodiments, the openings 530 are formed using a laser drilling process. In some other embodiments, the openings 530 are formed using a photolithography process, an etching process, an energy beam drilling process, another applicable process, or a combination thereof.

As shown in FIG. 5H, a mask 532 (or a stencil) is placed over the structure shown in FIG. 5G, in accordance with some embodiments. The mask 532 has openings that are used to define patterns of antenna elements that will be formed later. In some embodiments, the patterns are similar to the patterns shown in FIG. 9.

Afterwards, a squeegee 536 is used to move a conductive paste material 534 into the openings of the mask 532, as shown in FIG. 5H in accordance with some embodiments. Therefore, the conductive paste material 534 is printed thereon. In some embodiments, the conductive paste material 534 includes a copper-containing paste material, a gold-containing paste material, another suitable material, or a combination thereof.

Figure 5I:
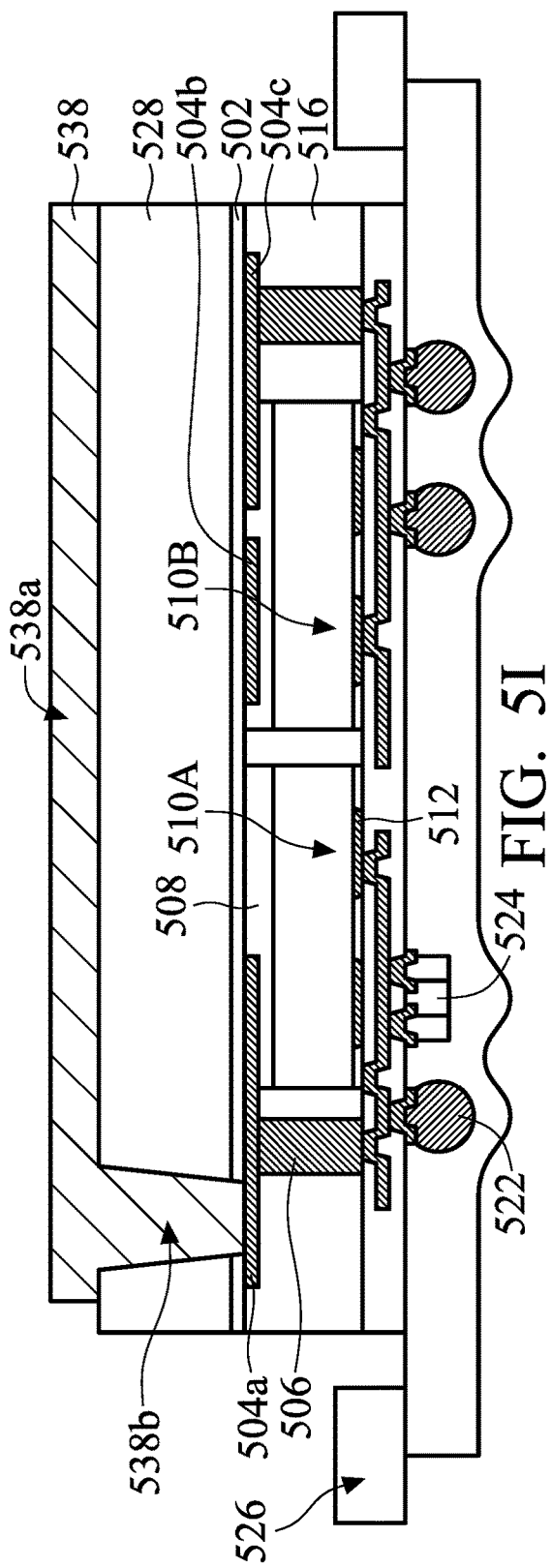

As shown in FIG. 5I, a reflow process is performed on the conductive paste material 534, in accordance with some embodiments. As a result, the conductive paste material 534 turns into conductive layers including a conductive layer 538 that fills the openings 530. These conductive layers form multiple antenna elements and conductive features. In some embodiments, the operation temperature of the reflow process is in a range from about 180 degrees C. to about 250 degrees C. In some embodiments, the operation time of the reflow process is in a range from 30 minutes to about 2 hours.

The portion of the conductive layer 538 that fills one of the openings 530 forms a conductive feature 538b. The portion of the conductive layer 538 over the protective layer 528 forms an antenna element 538a. In some embodiments, the antenna element 538a is electrically connected to the conductive element 512 of the semiconductor die 510A through the conductive feature 538b, the conductive element 504a, and the conductive feature 506.

In some embodiments, the conductive elements 504b and 504c are used as shielding elements. In some embodiments, the conductive elements 504b or 504c are electrically isolated from the conductive element 504a. The conductive element (shielding element) 504b or 504c may be used to prevent undesired interaction between the antenna elements 538a and the semiconductor die 510A or 510B.

Many variations and/or modifications can be made to embodiments of the disclosure. In some other embodiments, one of the conductive elements 504b and 504c is not used as a shielding element and is electrically connected to one of the antenna elements through another conductive feature (not shown in FIG. 5I) formed in the protective layer 528.

In some embodiments, the antenna element 538a is used to receive or transmit electromagnetic signals that have a wavelength. In some embodiments, the protective layer 528 has a thickness that is in a range from about 0.01 times the wavelength to about 0.25 times the wavelength.

Figure 5J:
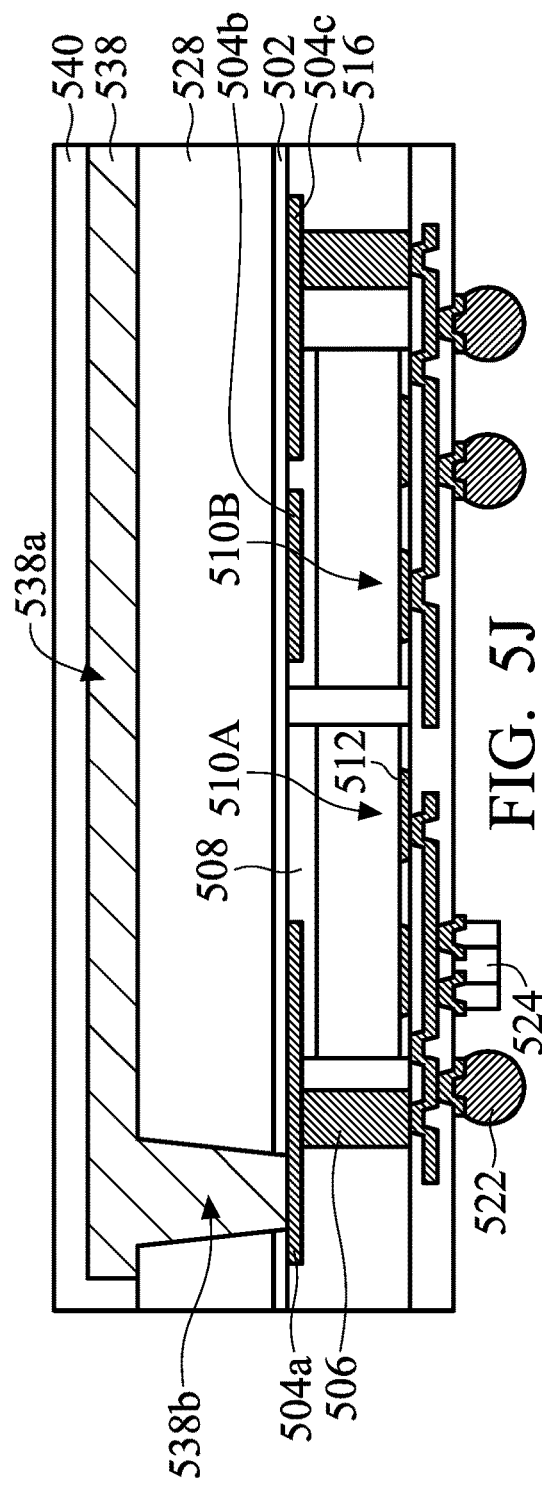

As shown in FIG. 5J, a passivation layer 540 is formed over the structure shown in FIG. 5I to protect the antenna elements, in accordance with some embodiments. The material and formation method of the passivation layer 540 may be similar to or the same as those of the passivation layer 102.

In some embodiments, a dicing operation is performed to obtain multiple chip packages. Afterwards, the tape frame 526 is removed, as shown in FIG. 5J in accordance with some embodiments. One of the chip packages is shown.

In the embodiments illustrated in FIGS. 5A-5J, the formation of the antenna elements involves a conductive paste printing process. However, many variations and/or modifications can be made to embodiments of the disclosure. In some other embodiments, the antenna elements are formed using a process other than the conductive paste printing process.

Figure 6A:
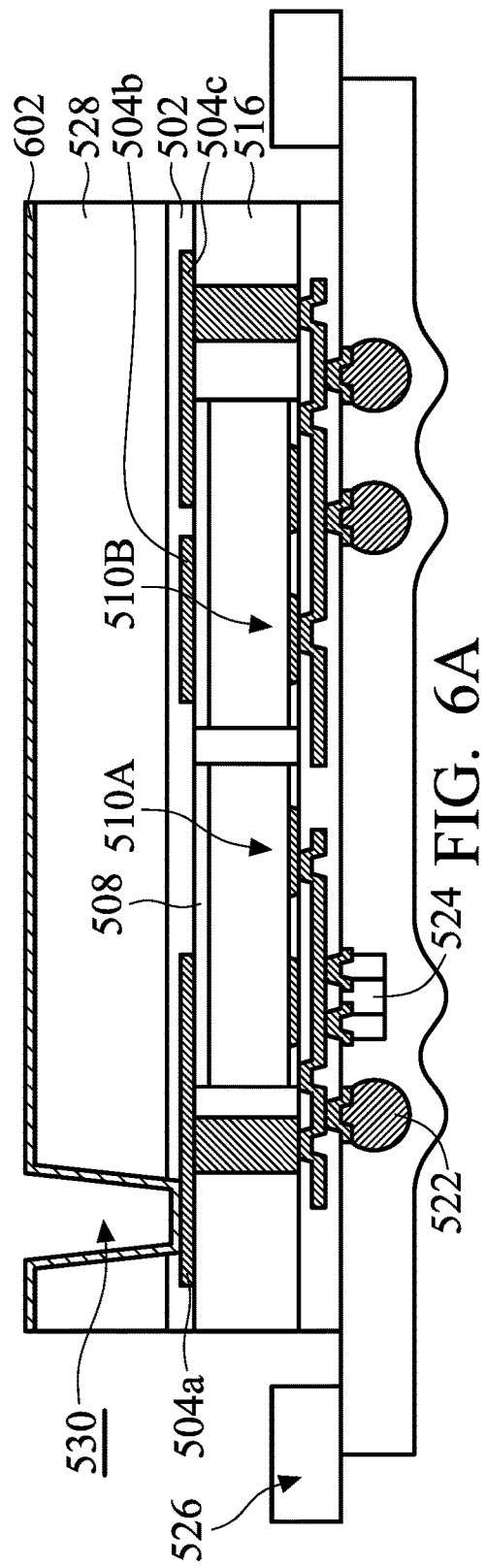

FIGS. 6A-6E are cross-sectional views of various stages of a process for forming a chip package, in accordance with some embodiments. As shown in FIG. 6A, a structure similar to the structure shown in FIG. 5G is provided or received. Afterwards, a seed layer 602 is deposited over the protective layer 528, as shown in FIG. 6A in accordance with some embodiments. In some embodiments, the seed layer 602 is made of or includes copper, titanium, gold, cobalt, another suitable material, or a combination thereof. In some embodiments, the seed layer is deposited using a PVD process (such as a sputtering process), a CVD process, another applicable process, or a combination thereof.

Figure 6B:
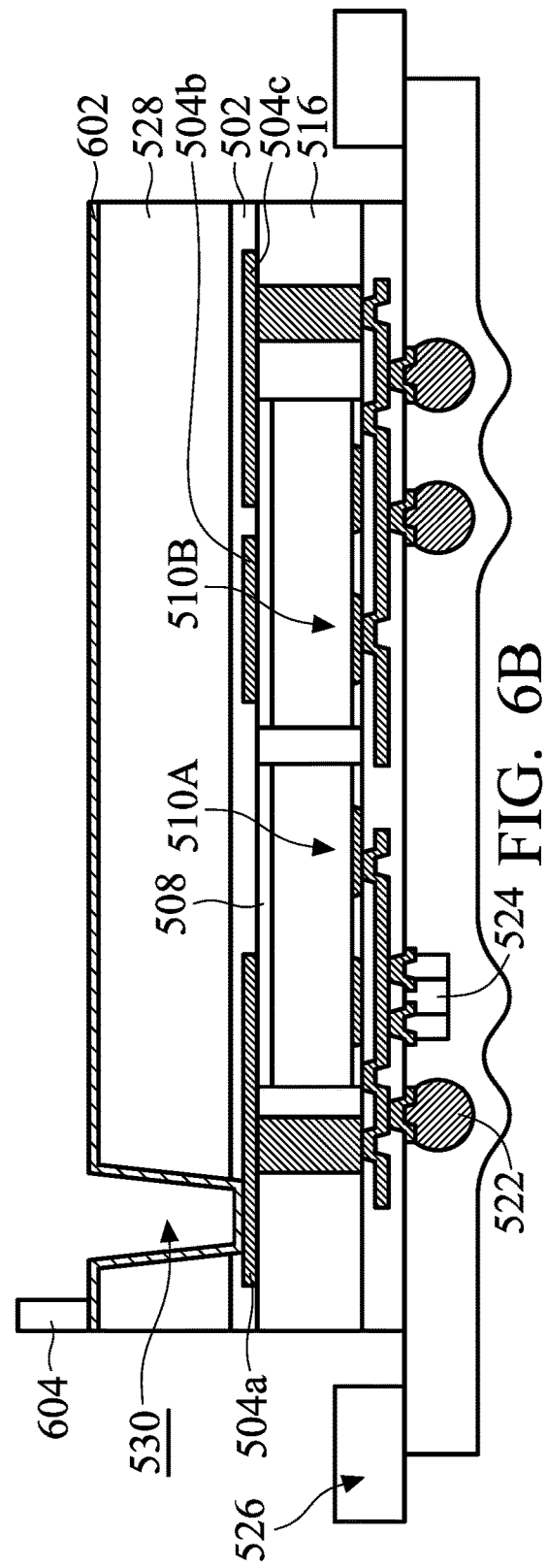

As shown in FIG. 6B, a mask layer 604 is formed over the seed layer 602, in accordance with some embodiments. The mask layer 604 has openings that define patterns of antenna elements that will be formed later. In some embodiments, the mask layer 604 is a patterned photoresist layer. In some embodiments, the patterns are similar to those shown in FIG. 9.

As shown in FIG. 6C, conductive layers including a conductive layer 606 is deposited on the seed layer 602, in accordance with some embodiments. These conductive layers form multiple antenna elements and conductive features. For example, the portion of the conductive layer 606 that fills one of the openings 530 forms a conductive feature 606b. The portion of the conductive layer 606 over the protective layer 528 forms an antenna element 606a. In some embodiments, the antenna element 606a is electrically connected to the conductive element 512 of the semiconductor die 510A through the conductive feature 606b, the conductive element 504a, and the conductive feature 506.

The conductive layer 606 may be made of or include copper, cobalt, gold, another suitable material, or a combination thereof. In some embodiments, the conductive layer 606 is deposited using an electroplating process, an electroless plating process, another applicable process, or a combination thereof. In some other embodiments, the conductive layer 606 is deposited using a PVD process, a CVD process, a plating process, another applicable process, or a combination thereof.

As shown in FIG. 6D, the mask layer 604 is removed, in accordance with some embodiments. A portion of the seed layer 602 is exposed after the removal of the mask layer 604. Afterwards, the exposed portion of the seed layer 602 is removed. An etching process may be used to remove the exposed portion of the seed layer 602.

Figure 6E:
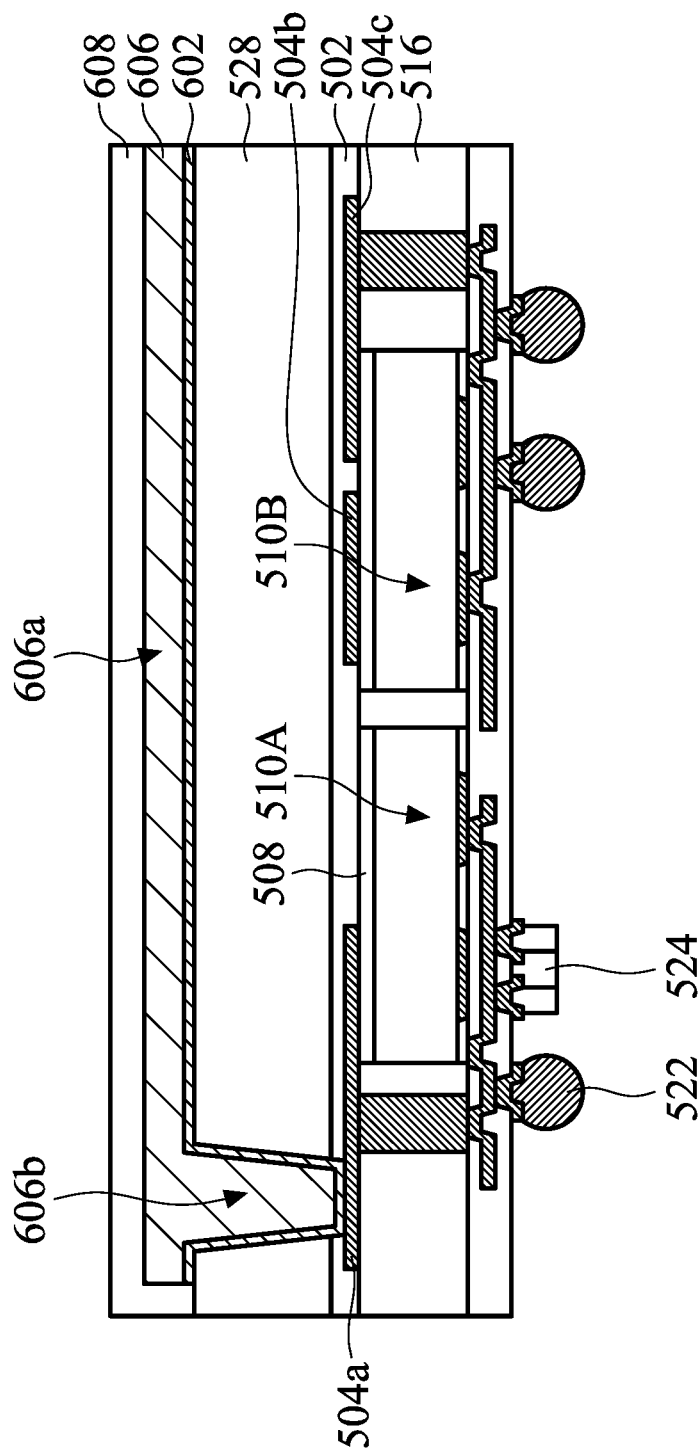

As shown in FIG. 6E, a passivation layer 608 is formed over the structure shown in FIG. 6D to protect the antenna elements including the antenna element 606a, in accordance with some embodiments. The material and formation method of the passivation layer 608 may be similar to or the same as those of the passivation layer 102.

In some embodiments, a dicing operation is performed to obtain multiple chip packages. Afterwards, the tape frame 526 is removed, as shown in FIG. 6E in accordance with some embodiments. One of the chip packages is shown.

Many variations and/or modifications can be made to embodiments of the disclosure. FIGS. 7A-7D are cross-sectional views of various stages of a process for forming a chip package, in accordance with some embodiments.

As shown in FIG. 7A, a structure similar to the structure shown in FIG. 5G is provided or received. Afterwards, a conductive pin 704 is installed into the opening 530, as shown in FIG. 7A in accordance with some embodiments. In some embodiments, the conductive pin 704 has a column portion and a base portion. The base portion may be wider than the column portion. In some embodiments, the conductive pin 704 is made of or includes copper, aluminum, gold, titanium, platinum, cobalt, another suitable material, or a combination thereof. In some embodiments, a solder layer 702 is used to affix the conductive pin 704 on the conductive element 504a.

As shown in FIG. 7B, a mask 706 (or a stencil) is placed over the structure shown in FIG. 7A, in accordance with some embodiments. The mask 706 has openings that are used to define patterns of antenna elements that will be formed later. In some embodiments, the patterns are similar to the patterns shown in FIG. 9.

Afterwards, a squeegee 710 is used to move a conductive paste material 708 into the openings of the mask 706, as shown in FIG. 7B in accordance with some embodiments. In some embodiments, the conductive paste material 708 includes a copper-containing paste material, a gold-containing paste material, another suitable material, or a combination thereof.

As shown in FIG. 7C, a reflow process is performed on the conductive paste material 708, in accordance with some embodiments. As a result, the conductive paste material 708 turns into conductive layers including a conductive layer 712 that fills the openings 530. These conductive layers form multiple antenna elements and conductive features. In some embodiments, the operation temperature of the reflow process is in a range from about 180 degrees C. to about 250 degrees C. In some embodiments, the operation time of the reflow process is in a range from 30 minutes to about 2 hours.

The portion of the conductive layer 712 that fills one of the openings 530 forms a conductive feature 712b. The portion of the conductive layer 712 over the protective layer 528 forms an antenna element 712a. In some embodiments, the antenna element 712a is electrically connected to the semiconductor die 510A through the conductive feature 712b and the conductive pin 704.

As shown in FIG. 7D, a passivation layer 714 is formed over the structure shown in FIG. 7C to protect the antenna elements including the antenna element 712a, in accordance with some embodiments. The material and formation method of the passivation layer 714 may be similar to or the same as those of the passivation layer 102.

In some embodiments, a dicing operation is performed to obtain multiple chip packages. Afterwards, the tape frame 526 is removed, as shown in FIG. 7D in accordance with some embodiments. One of the chip packages is shown.

Figure 8C:
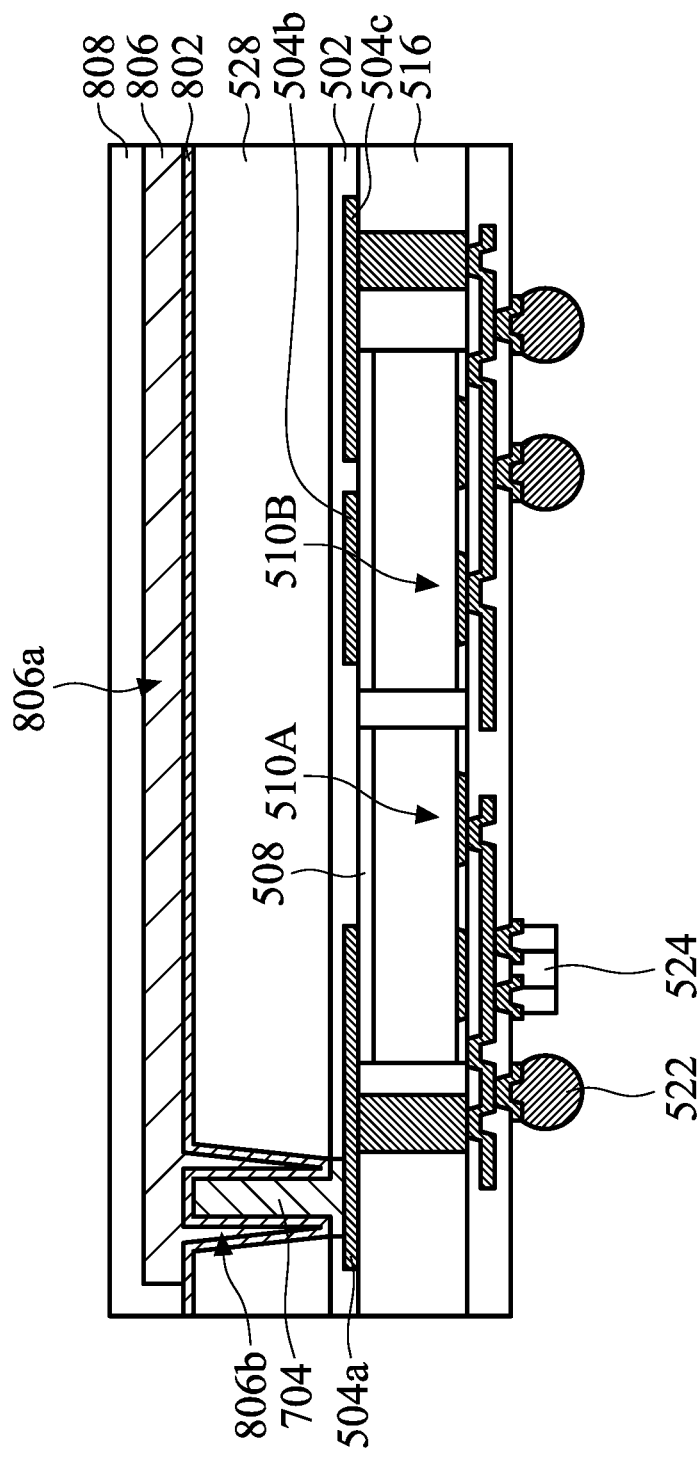

Many variations and/or modifications can be made to embodiments of the disclosure. FIGS. 8A-8C are cross-sectional views of various stages of a process for forming a chip package, in accordance with some embodiments.

As shown in FIG. 8A, a structure similar to the structure shown in FIG. 7A is provided or received. Afterwards, a seed layer 802 is deposited over the protective layer 528, as shown in FIG. 8A in accordance with some embodiments. In some embodiments, the seed layer 802 conformally extends along sidewalls of the opening 530 and sidewalls of the conductive pin 704. The material and formation method of the seed layer 802 may be similar to or the same as those of the seed layer 602.

As shown in FIG. 8B, a mask layer 804 is formed over the seed layer 802, in accordance with some embodiments. The mask layer 804 has openings that define patterns of antenna elements that will be formed later. In some embodiments, the mask layer 804 is a patterned photoresist layer. In some embodiments, the patterns are similar to those shown in FIG. 9.

As shown in FIG. 8C, conductive layers including a conductive layer 806 is deposited on the seed layer 802, in accordance with some embodiments. These conductive layers form multiple antenna elements and conductive features. For example, the portion of the conductive layer 806 that fills one of the openings 530 forms a conductive feature 806b. The portion of the conductive layer 806 over the protective layer 528 forms an antenna element 806a. In some embodiments, the antenna element 806a is electrically connected to the semiconductor die 510A through the conductive feature 806b and the conductive pin 704. The material and formation method of the conductive layer 806 may be similar to or the same as those of the conductive layer 606.

As shown in FIG. 8C, the mask layer 804 is removed, in accordance with some embodiments. A portion of the seed layer 802 is exposed after the removal of the mask layer 804. Afterwards, the exposed portion of the seed layer 802 is removed. An etching process may be used to remove the exposed portion of the seed layer 802.

As shown in FIG. 8C, a passivation layer 808 is formed over the seed layer 802 and the conductive layer 806, in accordance with some embodiments. The material and formation method of the passivation layer 808 may be similar to or the same as those of the passivation layer 102.

In some embodiments, a dicing operation is performed to obtain multiple chip packages. Afterwards, the tape frame 526 is removed, as shown in FIG. 8C in accordance with some embodiments. One of the chip packages is shown.

Embodiments of the disclosure form a chip package with antenna elements. An integrated fan-out (InFO) chip package is integrated with a protective layer with the antenna elements formed thereon. The antenna elements and the protective layer are stacked on the InFO chip package other than laterally disposed beside a semiconductor die in the chip package. One or more conductive features (such as vertical conductive features penetrating through the protective layer) are used to establish electrical connection between the semiconductor die in the InFO chip package and the antenna elements formed on the protective layer. Therefore, the electrical connections between the semiconductor die and the antenna elements may occupy a relatively small area. The size of the chip package may be reduced further. The antenna elements of the chip package may perform better.

In accordance with some embodiments, a chip package is provided. The chip package includes a semiconductor die having a conductive element and a first protective layer surrounding the semiconductor die. The chip package also includes a second protective layer over the semiconductor die and the first protective layer. The chip package further includes an antenna element over the second protective layer. The antenna element is electrically connected to the conductive element of the semiconductor die.

In accordance with some embodiments, a method for forming a chip package is provided. The method includes forming an antenna element over a support substrate and forming a first protective layer over the support substrate and the antenna element. The method also includes disposing a semiconductor die over the first protective layer. The method further includes forming a second protective layer over the first protective layer to surround the semiconductor die. In addition, the method includes forming electrical connection between a conductive element of the semiconductor die and the antenna element.

In accordance with some embodiments, a method for forming a chip package is provided. The method includes forming a first conductive feature over a support substrate and disposing a semiconductor die over the support substrate. The method also includes forming a first protective layer over the support substrate to surround the semiconductor die and the first conductive feature. The method further includes replacing the support substrate with a second protective layer and forming an antenna element over the second protective layer. In addition, the method includes forming electrical connection between a conductive element of the semiconductor die and the antenna element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
a semiconductor die having a conductive element;
an antenna element over the semiconductor die;
a first conductive feature electrically connecting the conductive element of the semiconductor die and the antenna element;
a protective layer surrounding the first conductive feature; and
a second conductive feature over the first conductive feature, wherein a portion of the second conductive feature is between the first conductive feature and the protective layer, and the first conductive feature is physically separated from the protective layer by the second conductive feature.

2. The chip package as claimed in claim 1, wherein compositions of the second conductive feature and the antenna element are the same.

3. The chip package as claimed in claim 1, wherein the protective layer is over the semiconductor die.

4. The chip package as claimed in claim 1, wherein the antenna element is over the protective layer.

5. The chip package as claimed in claim 1, further comprising a second semiconductor die covered by the protective layer.

6. The chip package as claimed in claim 1, further comprising a shielding element between the semiconductor die and the antenna element.

7. The chip package as claimed in claim 6, wherein the shielding element is electrically isolated from the antenna element.

8. The chip package as claimed in claim 1, wherein the antenna element is configured to receive or transmit an electromagnetic signal having a wavelength, and the protective layer has a thickness that is in a range from about 0.01 times the wavelength to about 0.25 times the wavelength.

9. The chip package as claimed in claim 1, wherein a portion of the antenna element extends into the protective layer and surrounds an upper portion of the first conductive feature.

10. The chip package as claimed in claim 1, further comprising a solder element in direct contact with a bottom surface of the first conductive feature.

11. A chip package, comprising:
a semiconductor die having a conductive element;
an antenna element over the semiconductor die;
a conductive feature electrically connecting the conductive element of the semiconductor die and the antenna element; and
a protective layer surrounding the conductive feature, wherein a portion of the antenna element is between the conductive feature and the protective layer.

12. The chip package as claimed in claim 11, wherein the conductive feature is a conductive pin having a lower portion and an upper portion, and the lower portion is wider than the upper portion.

13. The chip package as claimed in claim 11, wherein the antenna element is in direct contact with the conductive feature.

14. The chip package as claimed in claim 11, further comprising a conductive layer between the antenna element and the conductive feature.

15. The chip package as claimed in claim 14, wherein a portion of the conductive layer is between the antenna element and the protective layer.

16. A chip package, comprising:
a semiconductor die having a conductive element;
an antenna element over the semiconductor die;
a conductive feature electrically connecting the conductive element of the semiconductor die and the antenna element; and
a protective layer surrounding the conductive feature, wherein a bottom surface of the conductive feature is lower than a top surface of the protective layer and higher than a bottom surface of the semiconductor die, and the bottom surface of the conductive feature is lower than a bottom surface of the protective layer.

17. The chip package as claimed in claim 16, wherein a portion of the antenna element extends into the protective layer and surrounds an upper portion of the conductive feature.

18. The chip package as claimed in claim 17, wherein the conductive feature has a lower portion, and the lower portion of the conductive feature is wider than the upper portion of the conductive feature.

19. The chip package as claimed in claim 17, further comprising a conductive layer between the antenna element and the conductive feature.

20. The chip package as claimed in claim 16, further comprising a solder element in direct contact with a bottom of the conductive feature.

* * * * *